United States Patent
Sari et al.

(10) Patent No.: US 9,674,963 B1
(45) Date of Patent: Jun. 6, 2017

(54) MULTILEVEL MACHINE TO PROCESS COATINGS

(71) Applicants: Eric Sari, Chattaroy, WA (US); Brian Stumm, Chattaroy, WA (US); Roger Plough, Chattaroy, WA (US)

(72) Inventors: Eric Sari, Chattaroy, WA (US); Brian Stumm, Chattaroy, WA (US); Roger Plough, Chattaroy, WA (US)

(*) Notice: Subject to any disclaimer, the term of this patent is extended or adjusted under 35 U.S.C. 154(b) by 0 days.

(21) Appl. No.: 15/173,508

(22) Filed: Jun. 3, 2016

Related U.S. Application Data

(60) Provisional application No. 62/170,647, filed on Jun. 3, 2015.

(51) Int. Cl.
  *H05K 3/28* (2006.01)
  *B65G 43/00* (2006.01)
  *B65G 37/00* (2006.01)
  *G05B 19/042* (2006.01)

(52) U.S. Cl.
  CPC ........... *H05K 3/28* (2013.01); *B65G 37/00* (2013.01); *B65G 43/00* (2013.01); *G05B 19/0423* (2013.01); *B65G 2207/22* (2013.01)

(58) Field of Classification Search
  CPC .................................................... H05K 3/28
  See application file for complete search history.

(56) References Cited

U.S. PATENT DOCUMENTS

| | | | | |
|---|---|---|---|---|
| 4,334,607 A | * | 6/1982 | Dyer | B65G 47/52 198/468.1 |
| 5,271,953 A | * | 12/1993 | Litteral | B23Q 39/042 118/319 |
| 5,288,526 A | * | 2/1994 | Hogan | B05D 3/0209 118/58 |
| 5,387,444 A | * | 2/1995 | Bachmann | B05B 17/0623 118/313 |
| 6,115,939 A | * | 9/2000 | Kuster | F26B 15/04 34/194 |
| 6,295,728 B1 | * | 10/2001 | Shin | H05K 13/0061 198/339.1 |
| 6,699,329 B2 | * | 3/2004 | Mueller | B65G 49/0459 118/326 |
| 7,008,483 B2 | * | 3/2006 | Mann | B05D 3/067 118/500 |
| 7,619,867 B2 | * | 11/2009 | Christensen | H05K 3/284 340/632 |

* cited by examiner

*Primary Examiner* — Thomas Randazzo
(74) *Attorney, Agent, or Firm* — Brian J. Pangrle

(57) ABSTRACT

A machine can include a first conveyor configured to receive and convey a circuit assembly; a second conveyor configured to receive and convey a circuit assembly; a first set of opposing side panels adjacent to opposing sides of the first conveyor; a second set of opposing side panels adjacent to opposing sides of the second conveyor; a first mechanism that selectively raises and lowers the first set of opposing side panels; and a second mechanism that selectively raises and lowers the second set of opposing side panels.

12 Claims, 19 Drawing Sheets

MULTILEVEL MACHINE TO PROCESS COATINGS

RELATED APPLICATIONS

This application claims the benefit of and priority to a U.S. Provisional application having Ser. No. 62/170,647, filed 3 Jun. 2015, which is incorporated by reference herein.

TECHNICAL FIELD

Subject matter disclosed herein generally relates to equipment and techniques to process coatings.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
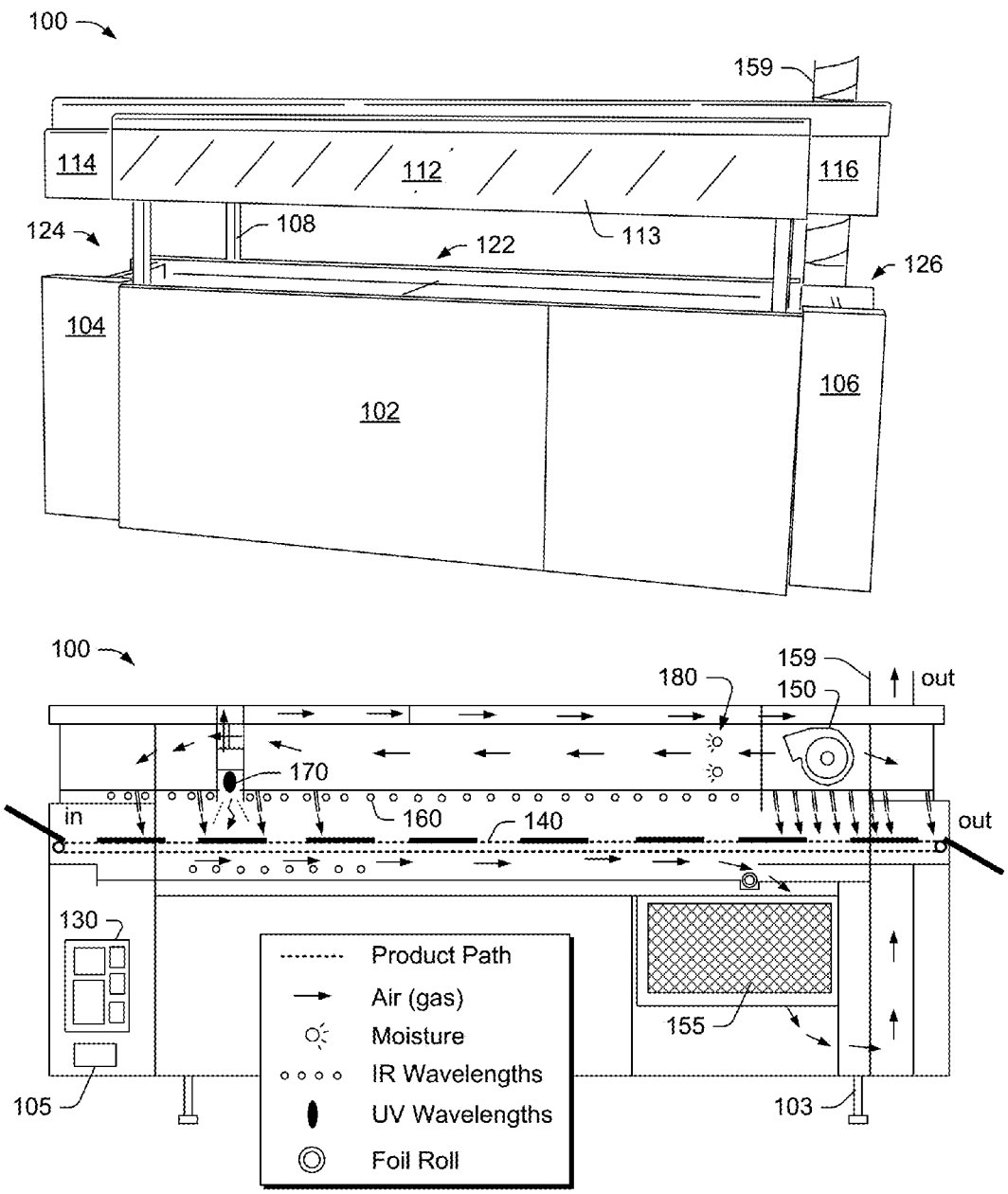
FIG. 1 is a perspective view of an example of a machine to process coatings and a schematic diagram that illustrates various features of such a machine.

The following description includes the best mode presently contemplated for practicing the described implementations. This description is not to be taken in a limiting sense, but rather is made merely for the purpose of describing general principles of the implementations. The scope of the described implementations should be ascertained with reference to the issued claims.

Many types of devices benefit from being coated, typically with a thin layer of material. In general, a coating is a covering that is applied to the surface of an object, often referred to as a substrate. Coatings may be applied as liquids, gases or solids. In many cases coatings are applied to improve surface properties of a substrate, such as appearance, adhesion, wetability, corrosion resistance, wear resistance, and scratch resistance. In other cases, in particular in printing processes and semiconductor device fabrication, a coating often forms an integral part of a finished product.

A particular type of coating, referred to as conformal coating, aims to protect by providing a non-conductive dielectric layer, for example, as applied to a printed circuit board assembly (PCBA) to protect components of the PCBA from damage due to any of a variety of factors (e.g., contamination, moisture, debris, or corrosion due to environmental factors). For PCBAs, conformal coating usually occurs at the end of an assembly process as conformal coating may be seen as messy, hazardous, time consuming, inconvenient and costly.

Commonly used conformal coatings include silicone, epoxy, acrylic, urethane and poly(p-xylylene) polymers (e.g., Parylene™). Chemical and physical properties of such materials differ and may offer different degrees of protection. Some characteristics of coating materials are described below.

Acrylic coatings are typically solvent based and usually low cost, tough, hard, and transparent. Acrylic coatings often exhibit low moisture absorption and have short drying times. However, some acrylic coatings do not demonstrate resistance to either abrasion or chemicals especially petroleum solvents and alcohol. Common acrylic coatings can withstand greater than 1500 volts and a temperature range of about −59 C to 132 C.

Urethane coatings are typically hard and durable and have resistance to solvents. Urethane coating may shrink during curing and associated film stress may stress one or more coated components. Urethane coatings take care in application and can be difficult to remove. Temperature range tends to be akin to acrylic coatings.

For coating a PCBA, the PCBA is typically cleaned prior to coating. Common methods of coating include spraying, brushing or dipping. Steps of a spray coating process may include: PCBA cleaning; PCBA masking; PCBA spraying; curing of coating; and mask removal. Where masking is not required, the masking and mask removal may be omitted. In general, a coating process includes application of coating material to a PCBA and curing of applied coating material. Various types of coating equipment exist, which may rely on one or more atomizing nozzles, needle dispensers on a robotic platform, etc., for example, as manufactured by companies such as Specialty Coating Systems (Indianapolis, Ind.), PVA (Cohoes, N.Y.) and Nordson Asymtek (Carlsbad, Calif.).

Some types of urethanes, acrylates or mixtures thereof (e.g., acrylate urethanes) rely on exposure to UV radiation to initiate, accelerate or otherwise promote curing. An example of a UV curable coating is marketed as HumiSeal® UV40 (HumiSeal, Pittsburgh, Pa.). Such a coating is marketed as having greater adhesion to a wide range of commonly used solder resists; higher IR (insulation resistance) and MIR (moisture insulation resistance); resistance to a wider range of solvents; greater flexibility at a wide range of temperatures; not brittle at low temperatures; and reliable secondary (shadow area) moisture activated cure mechanism. Regarding moisture or humidity, sometimes its presence is attributed to a so-called "secondary" curing process where exposure to UV radiation is referred to as a "primary" curing process. While a HumiSeal® coating is mentioned, other coatings are available from companies such as DYMAX Corporation and Henkel AG & Co. (e.g., Hysol® and Stycast™). For example, Henkel AG & Co. markets coatings for a variety of flexible or rigid substrates that can be effectively dried or cured, purportedly, through heat or UV radiation.

Some UV primary curable materials offer secondary heat cure. Various equipment and techniques described herein, in trials, cured DYMAX® Multi-Cure® 6-621 UV/heat cure coating material and DYMAX® 9481 UV/moisture cure coating material with acceptable tack free results. DYMAX Corporation data includes depth of cure versus time for different UV intensities over UV-A range (e.g., 320 nm to 395 nm). Intensities mentioned by DYMAX Corporation span a range from 50 mW/cm$^2$ to 10 W/cm$^2$.

As to the Multi-Cure® 6-621 coating material, a DYMAX Corporation product data sheet states that light curing must occur prior to heat cure. As described herein, a process can include passing a substrate coated with a UV primary cure and heat secondary cure coating material through a heat zone prior to passing the substrate through a UV zone. Such a process can further include passing the substrate through one or more additional heat zones after the UV zone. In some instances, heating of a substrate may occur in a UV zone, optionally where UV equipment provides for at least some heat energy in a controllable manner (e.g., consider adjustable clearance/height UV sources).

As to the 9481 coating material, a DYMAX Corporation product data sheet states that moisture may be used as a secondary cure mechanism for shadowed areas that cannot be cured with light, that light cure is recommended prior to moisture cure and that exposure to heat (typically 65 C to 80 C) and higher relative humidity will accelerate cure. As described herein, a process can include passing a substrate coated with a UV primary cure and moisture secondary cure coating material through a heat zone prior to passing the substrate through one or more additional zones, which may include zones with controlled or added moisture (e.g., controlled relative humidity (RH) or increased RH with respect to ambient air). In some instances, heating of a substrate may occur in a UV zone, optionally where UV equipment provides for at least some heat energy in a controllable manner (e.g., consider adjustable clearance/height UV sources).

In various examples, techniques to reduce oxygen may be employed as oxygen has been known to inhibit surface cure of a coating material. Such techniques may include use of an inert gas such as nitrogen, filtration/separation/reaction of air components, etc. Such techniques may include a machine with one or more gas jets to direct oxygen free or oxygen reduced gas to a surface of a coating.

Various examples herein refer, at times, to a circuit assembly, which may be a PCBA or other assembly that includes one or more electronic circuits. In various manufacturing processes, one or more electronic components are attached to a PCB to form a functional printed circuit assembly (e.g., PCA or PCBA). In through-hole construction, component leads may be inserted in holes of a PCB. In surface-mount construction, components may be placed on pads or lands on an outer surface of a PCB. In such types of construction, as appropriate, component leads may be electrically and often mechanically fixed to a board with a molten metal solder.

In general, a coating or coatings can help protect printed circuit boards and electronic components from thermal cycling and adverse environmental conditions. As described herein, a coating (or coatings) may be applied to any of a variety of types of products that may include circuitry or that may be intended for use with circuitry. A coating may be essentially solvent-free or low in VOC. While a coating, when hardened may contribute to some component stress, a coating can enhance mechanical strength, offer electrical insulation, and protect against vibration and shock.

A UV curable coating typically includes the following constituents: oligomers, monomers and catalysts. A coating may also include various additives, which may provide characteristics beneficial for a certain type of application. UV curable coatings typically have relatively short cure times that benefit those seeking quick turnaround and shipment of PCBAs. A machine for processing coatings often includes a conveyor configured to receive PCBAs and to convey PCBAs with a linear speed of, for example, about 5 to 10 feet per minute. Such a machine may be configured and operated to process about 250 PCBAs per hour. In general, the more PCBAs that can be coated in a given period of time, the greater the opportunity to operate a facility at full capacity, which, in turn, can optimize efficiency and keep costs competitive.

In a particular trial, a machine as described herein processed PCBAs coated with a DYMAX® coating material where the machine was operated with a conveyor speed of about 75 cm/m in (2.5 feet/min), which would provide an output of about 160 PCBs per hour (e.g., a PCB having length and width dimensions of about 10 in by 10 in and space between boards of about 1 in).

For so-called UV curable coatings, as described herein, factors such as temperature, humidity or temperature and humidity can be quite relevant. As described herein, a machine for processing coatings may be configured with one or more UV assemblies in conjunction with a temperature control assembly, a humidity assembly or a temperature control assembly and a humidity control assembly.

FIG. 1 shows an example of a machine 100 to process coatings. The machine 100 includes a base 102 with a product input end 104 and a product output end 106. A conveyor 122 extends along an axial length of the machine 100 between a product input end 124 and a product output end 126. A plurality of posts 108 support a top or cover 112 configured to cover product conveyed by the conveyor 122. In the example of FIG. 1, the cover 112 is fitted with one or more filters 113 as gas may be drawn into the machine 100 via one or more gas inlets of the top 112.

In a schematic view of FIG. 1, various features of the machine 100 are shown, some of which may be optional. The schematic view shows a product path (e.g., as defined by a conveyor path 140), an air or gas path associated with a mover 150 (see, e.g., straight arrows), heat sources 160, radiation sources that emit at least some UV radiation 170, and moisture sources 180. Also shown are base supports 103, a power source 105 (e.g., a power connector, converter, regulator, etc.), a controller 130, a filter 155 (e.g., carbon-based filter or other) and a foil roll (e.g., to provide foil to collect any debris such as board coating drips). A main gas flow path includes an intake near the radiation sources 170, a transverse flow path to the mover 150, and a reverse transverse flow path. Gas may be directed toward the product path via a series of vents or gas knives. Gas may enter the machine 100 at or near a product path inlet and may exit the machine 100 at or near a product path outlet. Where gas is directed via the vents or gas knives, at least some of the gas passes through a filter space configured to receive the filter 155 and continues to an exhaust pipe 159, which may be optionally fitted with one or more exhaust sensors or controllers.

The product path (e.g., as defined by the conveyor path 140) may be segmented into zones. In the example of FIG.

1, the product path includes a radiation zone associated with the radiation sources 170. As shown, a heating zone exists prior to the radiation zone 170 where the heating zone includes one or more heat sources 160. A cooling zone may exist proximate to the outlet 126 where gas in this zone may be relatively free of solvent or other material and may exit the machine 100 without passing through the filter 155 or the exhaust pipe 159. In general, a product path includes multiple zones. Such zones may include one or more gas convection zones, one or more IR radiation zones, one or more UV radiation zones, etc. A zone may optionally provide for multiple types of processing (e.g., IR and UV, UV and gas convection, UV and visible radiation, etc.). A product path may be configured to optimize a particular coating process. While radiative and convective heat transfer are mentioned, a process may include conductive heat transfer (e.g., consider contact between a board and a conveyor component).

The machine 100 may be configured to emit radiation in various wavelengths (e.g., UV, visible, IR). In general, solvent-based coatings involve evaporation of solvent, for example, via heating. Some silicone-based coatings rely on heat. The machine 100 may achieve heating primarily via medium to long wave IR which can reduce likelihood of entrapment of off-gassed materials (such as solvent) which could later cause bubbles that may pop and blister (e.g., unacceptable product characteristics). The machine 100 may provide for some convection heating and typically provides for convection cooling (e.g., in a cooling zone). Accordingly, as described herein, an assembly of a processing machine can be configured to emit radiation in a combination of UV, visible (VIS) and IR wavelengths. In various trials, a combination of such UV/VIS/IR wavelengths cured DYMAX® coatings without a need for a mercury-based radiation source. Mercury-based UV lamps emit significant amounts of IR and visible wavelength energy in a relatively uncontrolled manner. Flex circuits can melt under uncontrollable, high intensity heat and IR emissions of a conventional UV emitter (e.g., consider lamp-based systems). As described herein, the machine 100 can offer closed loop control of radiation (e.g., one or more of UV, VIS and IR). Such control can enhance product quality and reduce operator and other risks as well as conserve energy compared to conventional high-energy lamp-based emission systems (e.g., mercury vapor lamps, xenon-mercury short arc lamps, etc.).

As described herein, a circuit assembly may be a flex circuit assembly (e.g., a "flex circuit"). Flex circuits are commonly used in cell phones, notebook computers, etc., and conventionally coated with coatings that do not require UV curing because of damage that could be caused by a conventional UV emitter (i.e., high temperature risk due to IR emissions). A manufacturing process for flex circuits typically includes mounting electronic devices on flexible plastic substrates, such as polyimide, polyetheretherketone, polyester, etc. Flex circuits are often coated with solvent-based coatings (e.g., volatile organic solvents), water-based or silicone-based (e.g., suitable for room temperature vulcanizing). A coating supplier may provide a schedule as to cure, for example, room temperature or heat accelerated cure (e.g., 2 hours at RT, 30 minutes at 60 C, etc.). As described herein, machines and methods that can essentially decouple heating and UV exposure optionally allow for processing of flex circuits coated with one or more UV curable coatings. For example, an approach that relies on LED-based UV sources can significantly reduce risk of heat damage as associated with exposure of a heat-sensitive flex circuit to a conventional mercury-based lamp UV source.

As described herein, a machine for processing coatings can include a heated process cavity with independently controlled convection/infrared (IR) heating modules. During operation, warm air can be impinged directly onto product being conveyed via air knives located in one or more zones (e.g., consider two heat zones that border a UV zone). The IR modules may be rapid response long wave IR heaters that act to dry coating material quickly without solvent entrapment. Such a machine may have optimized heating and cooling zone sizes to maximize throughput and minimize use of floor space. Such a machine may have supply air introduced via large area filters running along the length of the machine on both sides. A large squirrel cage blower may be used to draw air through the top and force the air down onto product to cool it in one or more zones adjacent or at the exit end of the machine. The same blower may be configured to provide fresh supply air to each of the heating zones through a plenum above a process cavity. Supply air may be delivered in a single pass airflow design providing the largest volume of air to one or more zones adjacent to or at the entrance of the machine where significant solvent off-gassing can occur. Contaminated air and volatiles, where present, can be down-draft exhausted from the machine, for example, via one or more openings located between a last heat zone and a first cooling zone. Such a machine may include traffic control communications monitors for monitoring passage of product into, through and out of the machine.

As described herein, gas flow (e.g., air or other gas) can increase uniformity of heating. For example, cooling air at sufficient velocity and flow rate can act to cool low thermal mass areas while radiation (e.g., IR radiation) acts to heat these low thermal mass areas. In such an example, a cooling mechanism and a heating mechanism can be tailored to provide enhanced temperature control. One or more sensors may provide information to a temperature control algorithm that can control cooling, heating or both cooling and heating. A control algorithm may optionally be a closed-loop control algorithm, for example, where energy to a heater (e.g., IR radiation unit), energy to a gas mover, and energy to a conveyor are controlled to achieve one or more temperatures or temperature profile over a product path.

Where multiple machines are used in series, machine to machine communication can coordinate passage of substrates (e.g., boards) from one machine to the next. A PCBA industry standard (SMEMA) includes signals to tell up-line machines readiness status and also signals to inform down-line machines that a board is coming. As described herein, a controller can implement traffic control features, for example, to put a machine into a power saving or off mode (e.g., for UV or other energy consuming units). Such a controller may operate according to an industry signaling standard.

Figure 2:
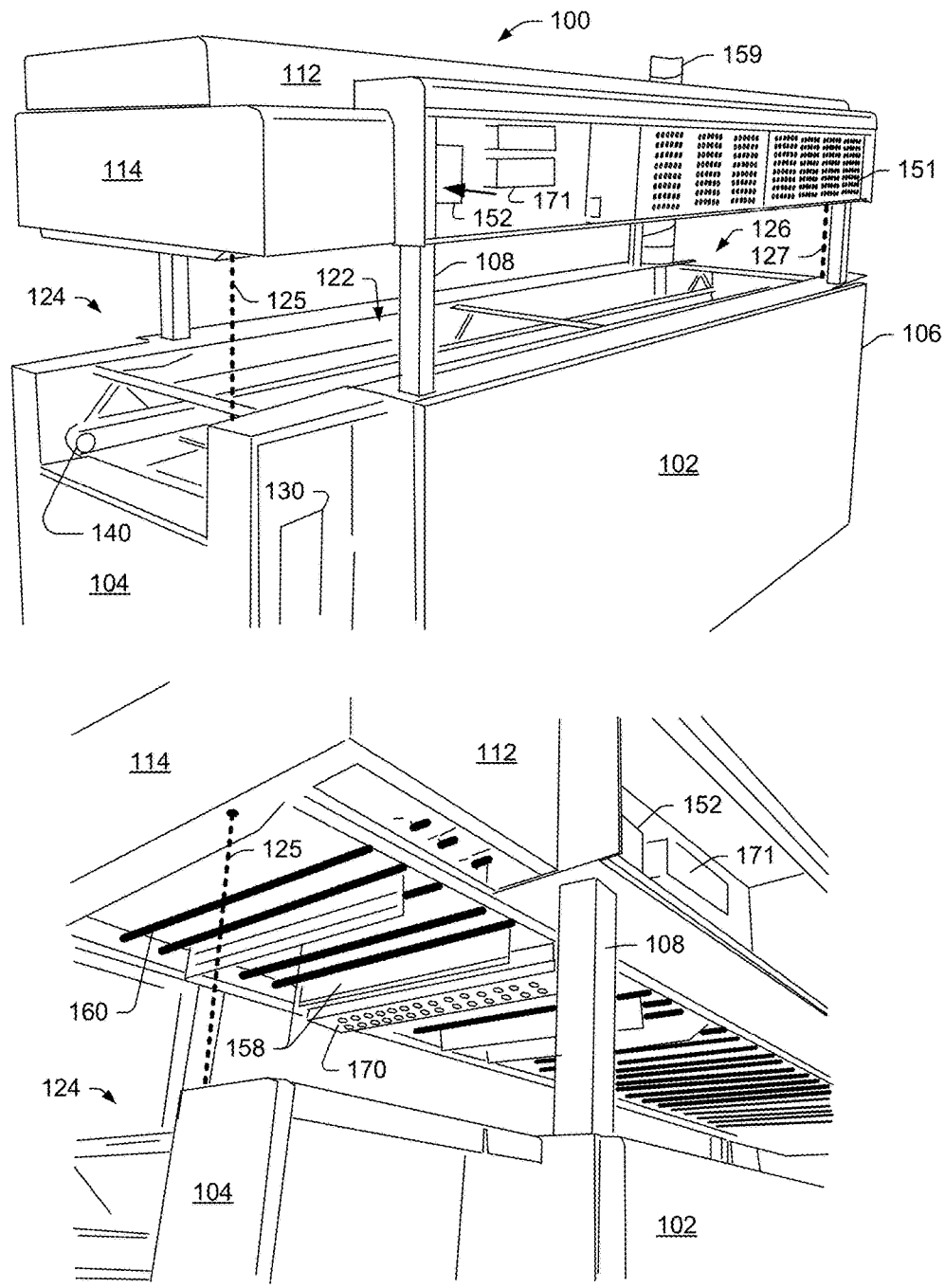
FIG. 2 is a series of perspective views of the machine of FIG. 1.

FIG. 2 shows a perspective view of the machine 100 with the one or more filters 113 (e.g., side filters) removed to expose a series of supports 151 and a gas inlet 152. Further, power supplies 171 are shown as being mounted on the top 112 for supplying power to one or more of the radiation sources 170. In another perspective view, the machine 100 is shown as including vents or gas knives 158, IR emitters as heat sources 160 as well as a bank of radiation emitters 170 that emit at least some UV radiation. The heat sources 160 may be constructed from quartz and have a cylindrical shape (e.g., quartz rods).

In general, during an operation to process coatings, the cover 112 is lowered to cover the product path, as defined by the conveyor path 140. Various reasons may exist for lowering a cover including diminishing leakage of radiation (e.g., IR, UV, etc.), diminishing leakage of gas, optimizing convection (e.g., velocity, flow rate at substrate, etc.), optimizing UV radiation dosage, optimizing operation of a unit (e.g., UV LED unit), etc. Product entering the machine 100 via the input end 104 (e.g., as received by the conveyor) travels in a pre-UV radiation heat zone that includes heat sources 160 and gas knives 158. The gas knives in the pre-UV radiation zone may be disposed at an angle to entrain some environmental gas (e.g., air) from a product input opening defined at least in part by the input end 114 of the cover 112 and the input end 104 of the base 102. In general, the amount of entrained environmental gas, if any, will be less than the amount of gas drawn by the mover 150. In a particular example, the machine 100 may be configured to move gas such as air at about 200 CFM.

As described herein, gas moving in the machine 100 can serve a variety of purposes. Such purposes may relate to cooling one or more components of the machine 100 as well as cooling or heating product traveling along a product path. Gas may further act to carry moisture, solvents, other volatile material or debris. Where gas carries material, the filter 155, if present, may act to filter out such material. As mentioned, a cooling zone may direct gas to the product path where the gas does not pass through a filter (e.g., as a significant amount of solvent may have evaporated in prior zones). Such cooling gas may be optionally directed in a manner where the gas does not pass a moisture source to become humidified. For example, in the example of FIG. 1, the mover 150 may be in a chamber where some of the gas pressurized by the mover 150 may be directed to a cooling zone (e.g., through one or more vents or knives).

The machine 100 may be operated to process a solvent-based coating where by the time the product reaches a cooling zone there is no off-gassing or insignificant off-gassing that could contaminate the cooling gas. In such an example, the heated zones of the process cavity have a single pass gas flow arrangement where the heated process cavity air is exhausted through a filter cavity that may consist of pre-filter, gas phase filtration, post-filter and finally MIRV10. Optionally, such an arrangement may be configured with greater filtration of exhausted gas (e.g., including HEPA filtration).

In the machine 100, gas flow through the heated process cavity zones may be about 200 CFM where a small portion of the gas may enter the process cavity at the entrance 124. Gas flow may be dependent or determined based on one or more exhaust controller settings. Where a machine is configured for processing of solvent-based coatings, a controller may set a minimum gas flow of about 150 CFM to ensure safe LEL levels. For example, for processing solvent-based coatings (e.g., 70% solvents) with a 30 mil thickness on a 20"×20" board, that is double side coated, with a gas flow of at least 150 CFM, exhaust gas would not reach a 25% LEL (Limit Explosive Level).

In the example of FIGS. 1 and 2, the machine 100 is configured to move gas in a manner that cools radiation sources 170 via gas flow and optionally in a manner that carries moisture to the product path. For example, regarding moisture, the moisture sources 180 may be spray nozzles that atomize water downstream from the mover 150, which may be a compressor or fan.

In the example of FIG. 2, the machine 100 is shown as including a fore sensor beam 125 and an aft sensor beam 127, which may be optional or otherwise positioned (e.g., to detect product at the input end and to detect product at the output end). The sensor beam 125, the sensor beam 127 or both may be used for any of a variety of purposes. As described herein, one or more sensors may provide information to a power saving module that acts to save power. For example, if no product is on the product path, then the radiation sources 170 may be adjusted to a low power or off state. In instances where the radiation sources 170 include LEDs, current may be controlled to power off the LEDs, which may prolong longevity, conserve power and reduce potential exposure of one or more operators to radiation emitted from the LEDs.

Figure 3:
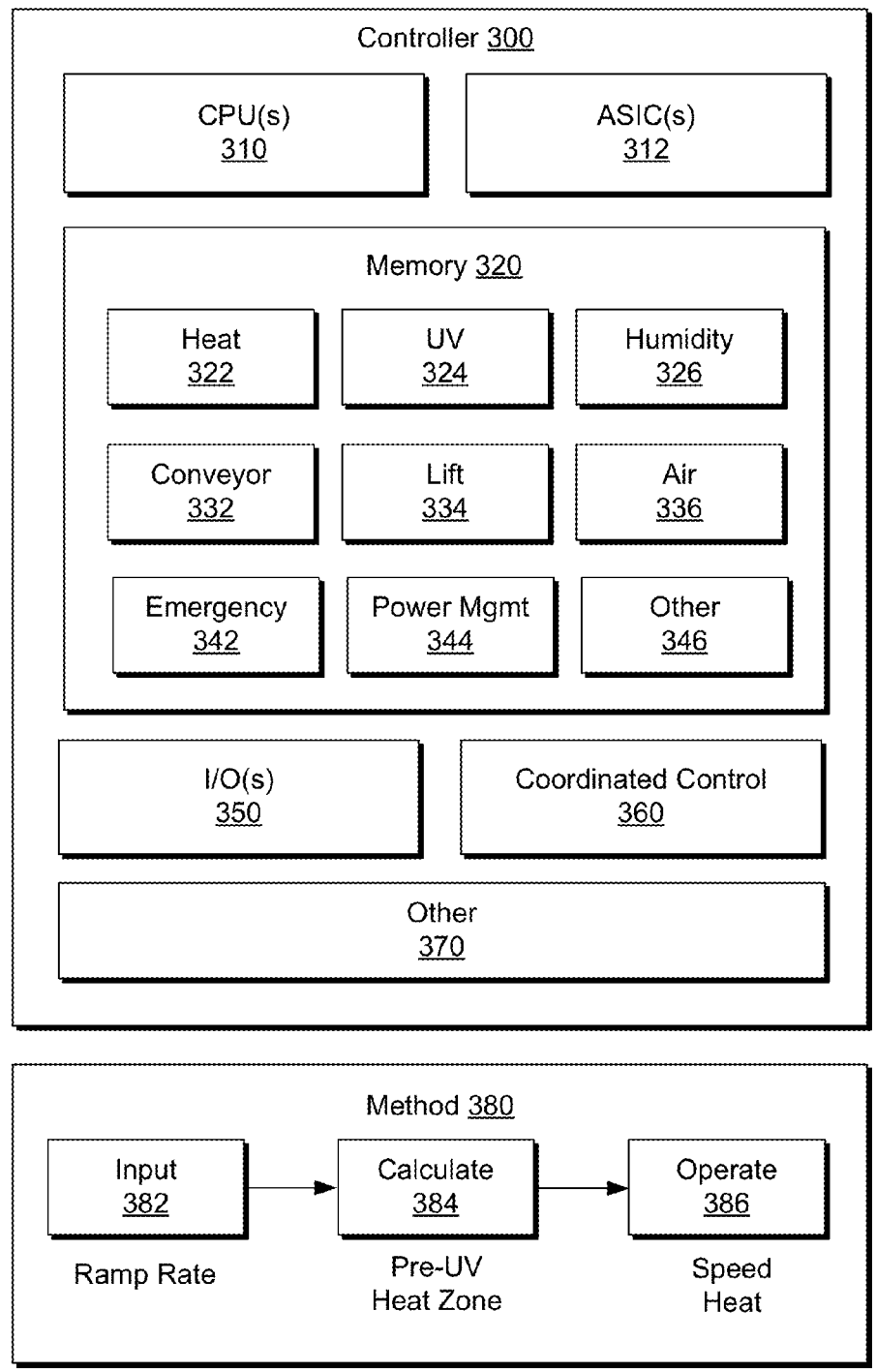
FIG. 3 is a block diagram of an example of a computing unit configured for controlling various processes of a machine to process coatings.

FIG. 3 shows an example of a controller 300, which may be suitable implemented as the controller 130 of the example of FIG. 1, and an example of a method 380. The controller 300 may be a component physically attached to a machine to process coatings or it may be separate and in communication with such a machine (e.g., via wire or wirelessly). Such a controller 300 may be configured to control more than one machine and may provide for coordinate control, for example, where a change in one or more conditions occurs at one machine and the information is propagated to control schemes for one or more other machines or where a global condition changes and the information is relied on to adjust control schemes at one or more machines. In some instances, machines may be oriented sequentially where control at one machine depends on one or more conditions at a preceding machine. The controller 300 may be configured to provide control for one or more of the foregoing scenarios or optionally one or more other scenarios.

In the example of FIG. 3, the controller 300 is shown as including one or more processors or CPUs 310 (e.g., single core or multi-core), one or more ASICs 312 (which may be optional), memory 320, one or more I/Os 350, a coordinated control module 360 (which may be optional) and one or more other components or modules 370.

In the example of FIG. 3, the memory 320 is shown as including one or more blocks, which may be provided as instructions to instruct the one or more processors 310. The blocks include a heat block 322, a UV block 324, a humidity block 326, a conveyor block 332, a lift block 334, an air or gas block 336, an emergency block 342, a power management block 344 and optionally one or more other blocks 346; noting that some of the block may be optional.

The method 380 of FIG. 3 includes an input block 382 to receive input data such as substrate characteristics (e.g., thermal mass, thermal rise rate, size, etc.), coating material characteristics (e.g., primary cure, secondary cure, etc.), ambient conditions, etc. A calculation block 384 includes calculating appropriate process conditions based at least in part on the received input. An operation block 386 includes operating a machine to process a coated substrate. The method 380 may be implemented to determine heating parameters for a heat zone (or zones) prior to a UV zone. For example, for a maximum thermal rise rate of 2 C per second (e.g., accounting for thermal mass, etc.) and a target UV zone temperature of 65 C and an ambient temperature of 25 C, the calculation block 384 may calculate a conveyor speed and a pre-UV zone, heat zone temperature that ensure that a coated substrate experiences heating less than the maximum thermal rise rate (e.g., 2 C per second) yet reaches a target temperature (e.g., 65 C) prior to passing into a UV zone.

For coating materials that benefit from secondary heat cure, a controller may rely information as to a pre-UV zone, heat zone process and optionally information as to a UV zone process in determining a heating process parameters in one or more post-UV zones.

As described herein, a controller may control a pre-UV zone, heat zone to achieve a particular slope (e.g., 0, positive or negative) of coated substrate temperature. Such control may include conveyor speed control, wattage, clearance or height between a heat source (or sources) and a coated substrate.

As described herein, a zone temperature may refer to a product temperature (e.g., a coated substrate temperature) or a gas temperature in the zone. Zone temperatures may also be available depending on arrangement of sensors. For example, a non-contact surface temperature sensor (e.g., laser thermometer, etc.) may be used to measure surface temperature of a coated product while a thermocouple is used to measure gas temperature. A control algorithm may be configured to receive information as to one or more temperatures to optimize a process. A non-contact temperature sensor may be configured to compensate for motion, if appropriate, configured to travel with a product conveyed through a machine, or configured to measure temperature for a brief stationary moment of a product on a path (e.g., optionally coordinated with a conveyor control algorithm).

As described herein, a method can include displaying a graphical user interface and receiving an instruction via the graphical user interface, the instruction for adjusting one or more of conveying a treated product, exposing a treated product to IR radiation, emitting UV radiation, exposing a treated product to emitted UV radiation, and optionally exposing a treated product to one or more of IR radiation to promote curing of a UV-curable coating material and humidity to promote curing of a UV-curable coating material.

Figure 4:
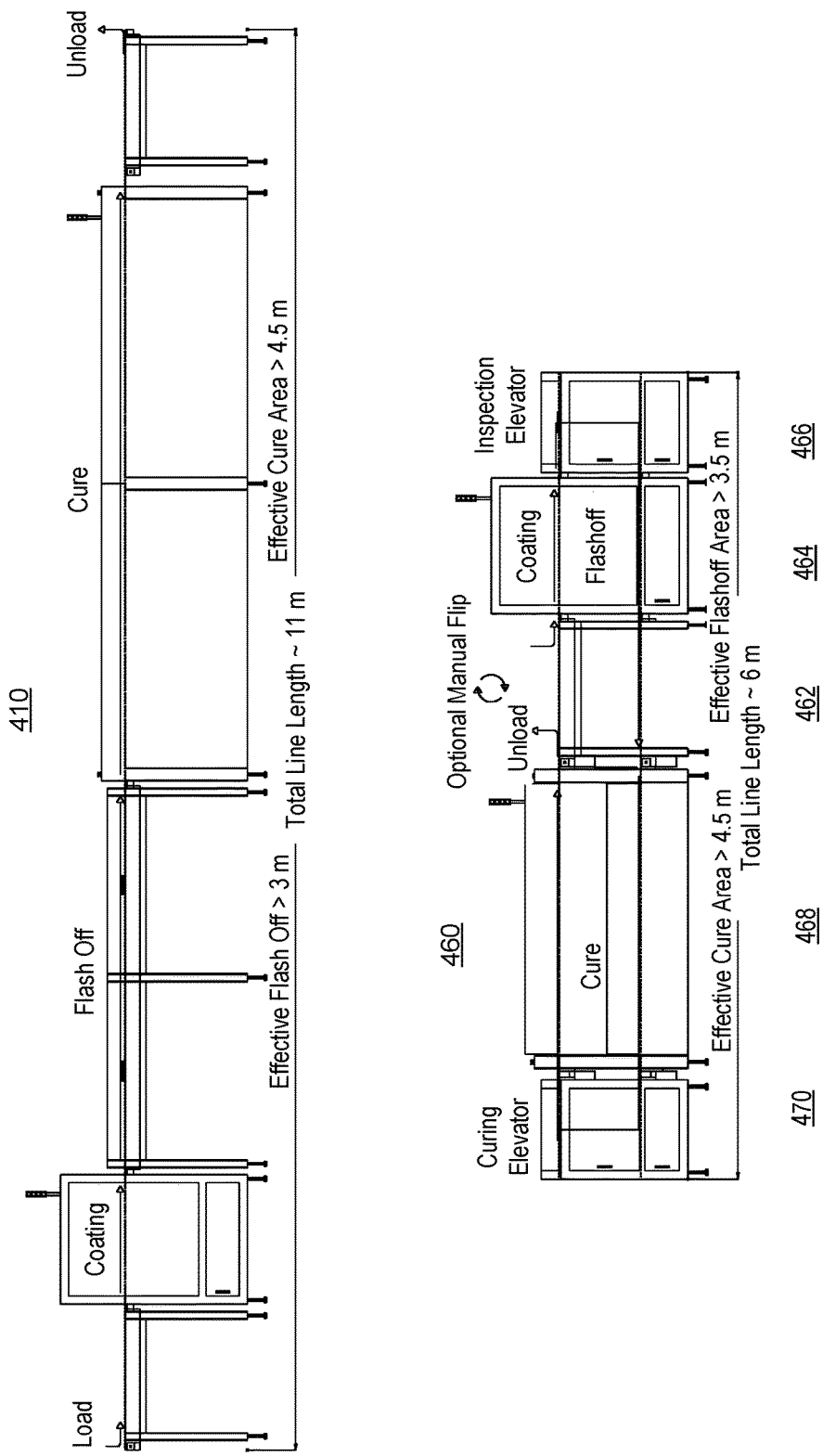
FIG. 4 is a diagram of examples of machines.

FIG. 4 shows examples of two machines 410 and 460 that can include, for example, conformal coat (e.g., fluid dispensing) equipment to form process lines.

The machine 410 has a single level conveyor while the machine 460 includes a multilevel conveyor. As shown, the machine 460 includes a return conveyor that may be present in a lower part, for example, to at least return a pallet (e.g., carrier tray) to a position that may be near an entrance of the line.

The machine 460 includes a multilevel loading/unloading station 462, a multilevel coating/flash off unit 464, an elevator 466, a multilevel oven 468 and an elevator 470.

A method can include loading a product at the loading/unloading station 462 (e.g., at the top level), conveying the product for applying a coating to the product at the coating upper level of the multilevel coating/flash off unit 464, conveying the product to the elevator 466, which can include one or more inspection stations (e.g., visual and/or machine inspection as to the applied coating or coatings, etc.), lowering the product from an upper level to a lower level of the elevator 466 (e.g., via a lift mechanism of the elevator), conveying the product to the flash off lower level of the multilevel coating/flash off unit 464 (e.g., noting that the path/time for evaporation of volatiles can commence directly after coating), conveying the product via the lower level of the loading/unloading station 462 (e.g., which can allow for further evaporation of volatiles, etc.) to the lower level of the multilevel oven 468, conveying the product in the lower level of the multilevel over 468 and performing at least one curing process in the multilevel oven 468 (e.g., to at least in part cure/polymerize the coating), conveying the product to the elevator 470, raising the product from a lower level of the elevator 470 to an upper level of the elevator 470, conveying the product in the upper level of the multilevel oven 468 and performing at least one curing process in the multilevel oven 468 (e.g., to further cure one or more coatings, etc.), and conveying the product to the upper level of the loading/unloading station 462 where the product may be unloaded, repositioned (e.g., flipped, rotated, etc.), etc.

In the example of FIG. 4, the length of the machine 460 is shorter than the length of the machine 410; noting that the machine 410 and the machine 460 may be referred to as systems. The machine 460 can occupy a smaller footprint than the machine 410. In a manufacturing facility, more machines may be included or lesser floor space may be utilized where the machines include one or more of the machines 460.

In the example of FIG. 4, the machine 460 can provide an effective flash off distance that is greater than about 3 meters and can provide an effective cure distance that is greater than about 4 meters while the total length of the machine may be approximately 6 meters. As an example, a multilevel oven can include an elevator and a coating/flash off unit can include an elevator. As an example, a conveyor mechanism may include grips that can grip a product and the conveyor mechanism may be a loop with an upper level and a lower level such that a product can be conveyed along the upper level and the lower level via the loop. As an example, a conveyor mechanism can include edge grips that grip edges of a product, a middle grip that can grip a surface of a product, a belt that can grip a product (e.g., with belt-mounted grips, etc.), etc. As an example, one or more products may be placed on or otherwise carried by a tray or other type of carrier where a conveyor mechanism may grip or otherwise couple to the tray or other type of carrier.

As an example, one or more elevators can include circuitry, gas handlers, UV emitters, IR emitters, humidifiers, inspection equipment, etc. that can perform one or more functions while a product is in an elevator (e.g., stationary, being lifted and/or being lowered). As an example, product transport mechanisms can be operatively coupled to transport a product from one portion of a machine to another portion of a machine.

As an example, an oven can include liftposts operated by air cylinders, hydraulic cylinders, electricity (e.g., electric motors), etc. In such an example, a top of the oven may be raised and lowered where a distance traveled may be of the order of about twelve inches. In such an example, wiring can be included in a liftpost or liftposts for connections to components in the top of the oven (e.g., for operation of IR and/or UV and/or humidity and/or modified atmosphere components). As an example, UV may be long arc and/or LED. Such features may be utilized to accelerate coating cure times. As an example, such an oven can be a multilevel oven. As an example, a multilevel oven can be part of a machine or system that allows for one person operation (OPO). For example, the loading/unloading station of the multilevel machine 460 allows for OPO.

In the example of FIG. 4, the multilevel oven 468 includes a top that can be raised and lowered to access the upper level and includes sides that can be raised and lowered to access the lower level. In such an example, the oven 468 can be a dual-sided accessible oven such that an operator can be positioned on either side and be able to raise/lower the top and/or the sides to access the upper level and/or the lower level. Such an approach provides additional flexibility to the machine 460 where the loading/unloading station 462 can also be configured for access via one or both sides.

While OPO is mentioned, the machine 460 can also allow for two person operation (TPO) where, for example, one person may be on one side and one person on another side, for example, for purposes of loading and/or unloading, etc.

As to the top and sides, a multilevel oven can allow for independent access to an upper level and independent access to a lower level of the multilevel oven. For example, each level can include a "top" (e.g., one being internal) where a top of each level oven can go up independently or together and where raising of the lower "top" (e.g., the internal top of the lower level) can be accomplished while raising one or more side panels (e.g., sides) to access the lower level (e.g., a product transport mechanism where product can be conveyed, etc.).

As an example, a multilevel oven can include ball screws and stepper motors that can move liftposts (e.g., four per level for a total of eight) where a controller can be utilized to manage raising/lowering (e.g., to help ensure equal amount of lifting by sets of posts). As an example, a top of an upper level can open about fourteen inches (height) and side panels associated with a lower level can open about ten inches (height). In such an example, one or more pieces of equipment internal to the oven and above a lower level product path may also be raised.

As an example, a multilevel oven can include four liftposts, ball screws and stepper motors operated via a controller. In such an example, a top and upper level of a multilevel oven may moves up/down about fourteen inches. In such an example, to access a lower level of the multilevel oven, four electric solenoid pins can move sideways such that as the top of the multilevel oven begins to go up, the mechanism provides for moving about four inches (e.g., a delay or distance gap) before side panels of a lower level of the multilevel oven begin to open. Moving beyond the four inches, the side panels (e.g., reflector panels of the lower level) can begin to move into a top portion of the lower level as the top of the multilevel oven (e.g., top covering the upper level) opens to about eight inches. Next, coordinated movement of the top and side panels can occur where, for example, they move together for about an additional six inches. In such an example, the top of the upper level is open about fourteen inches (height) and the side panels of the lower level oven are open about ten inches (height).

As an example, a multilevel oven such as, for example, the multilevel oven 468 of FIG. 4, can include a top that can move upwardly and downwardly for access to and for closure of an upper level path and can include one or more side panels that can move upwardly and downwardly for access to and for closure of a lower level path. In such an example, the top and the one or more side panels can be independently moved and/or moved in a coordinated manner. As mentioned, when moved in a coordinated manner, the top may move upwardly a distance prior to upward movement of the one or more side panels and after such movement coordinated movement may occur.

Figure 5:
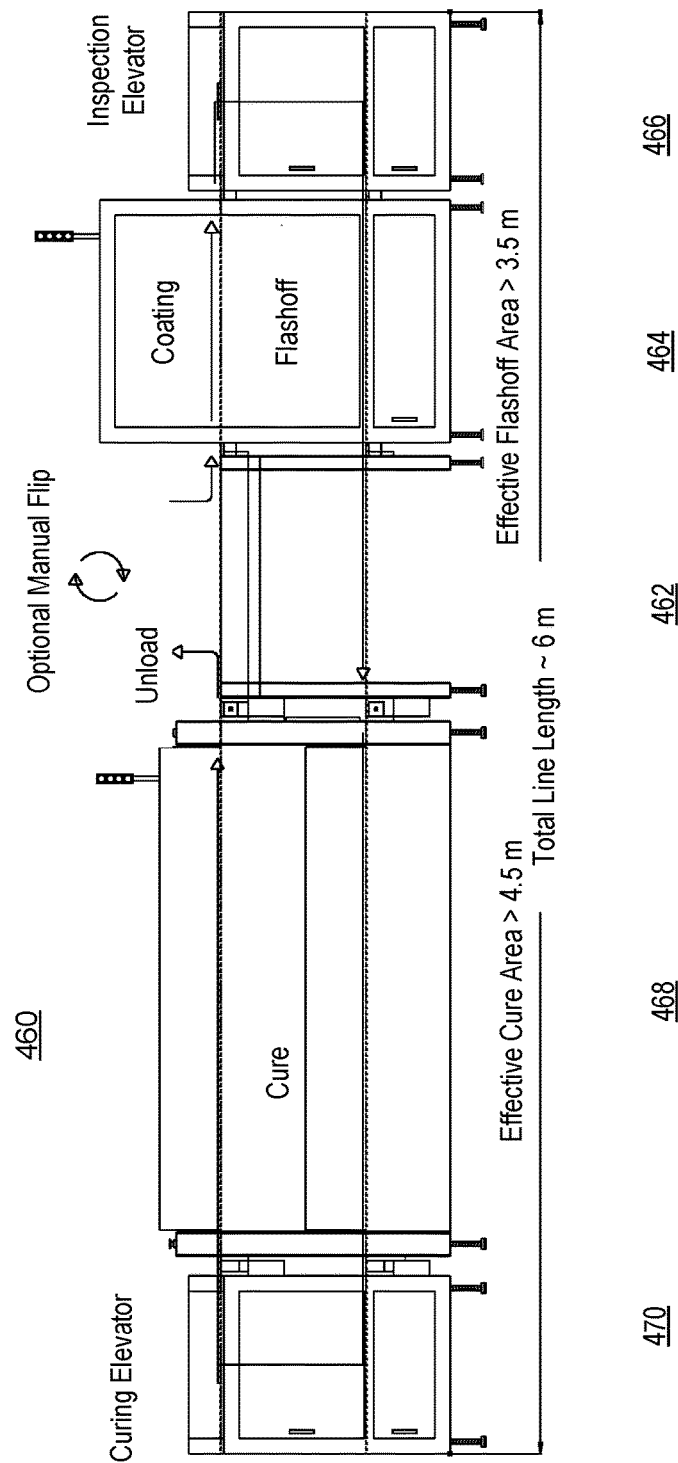
FIG. 5 is a diagram of an example of a machine.

FIG. 5 shows the machine 460 in an enlarged view. As shown, the machine 460 can include a curing elevator, a cure zone, a coating zone, a flash-off zone, an inspection elevator, a load zone, an unload zone, etc.

As an example, a product may be loaded in the load zone, be conveyed through the coating zone, pass into the inspection zone, be conveyed by an elevator to a flash-off zone, be conveyed through the flash-off zone, pass into a first level cure zone, be conveyed to a curing elevator, be transported by the curing elevator to a second level cure zone, be conveyed through the second level cure zone to an unload zone (e.g., for unloading).

As an example, the machine 460 may be ambidextrous. For example, the loading and unloading may be performed via one side and/or another side. As an example, the machine 460 may include a cure assembly portion and a coating assembly portion where a loading/unloading portion is disposed therebetween. As an example, the curing portion can include sides that can be positioned to access one or more conveyors.

As an example, a controller may include control circuitry to control one or more features of the machine 460. As an example, consider a controller with a cure control module and a coating control module. In such an example, coordinated control may be effectuated.

As an example, the inspection elevator of the machine 460 may include optics and image acquisition and/or analysis circuitry. For example, consider machine vision circuitry that can inspect a coated unit (e.g., a board with one or more components, etc.) as to one or more coating quality parameters. As an example, the elevator may include a rejection port or the machine 460 may include a rejection port at another region, for example, to reject a unit based at least in part on inspection.

As an example, a machine can include multiple levels. As an example, a first level can include a roof and a second, adjacent level can include a floor. In such an example, the roof may be movable toward the floor, for example, to increase a distance between the roof and a conveyor. As an example, a level can include a roof and a floor where, for example, a conveyor may be disposed between the roof and the floor.

As an example, in a multi-level machine, a first level can include a conveyor to convey in a first direction and a second level can include a conveyor to convey in a second direction, which may be opposite to the first direction. For example, consider one conveyor conveying from left to right and another conveyor conveying from right to left. In such an example, an elevator may be configured to elevate material (e.g., boards, etc.) from one level to another level (e.g., for conveyance).

Figure 6:
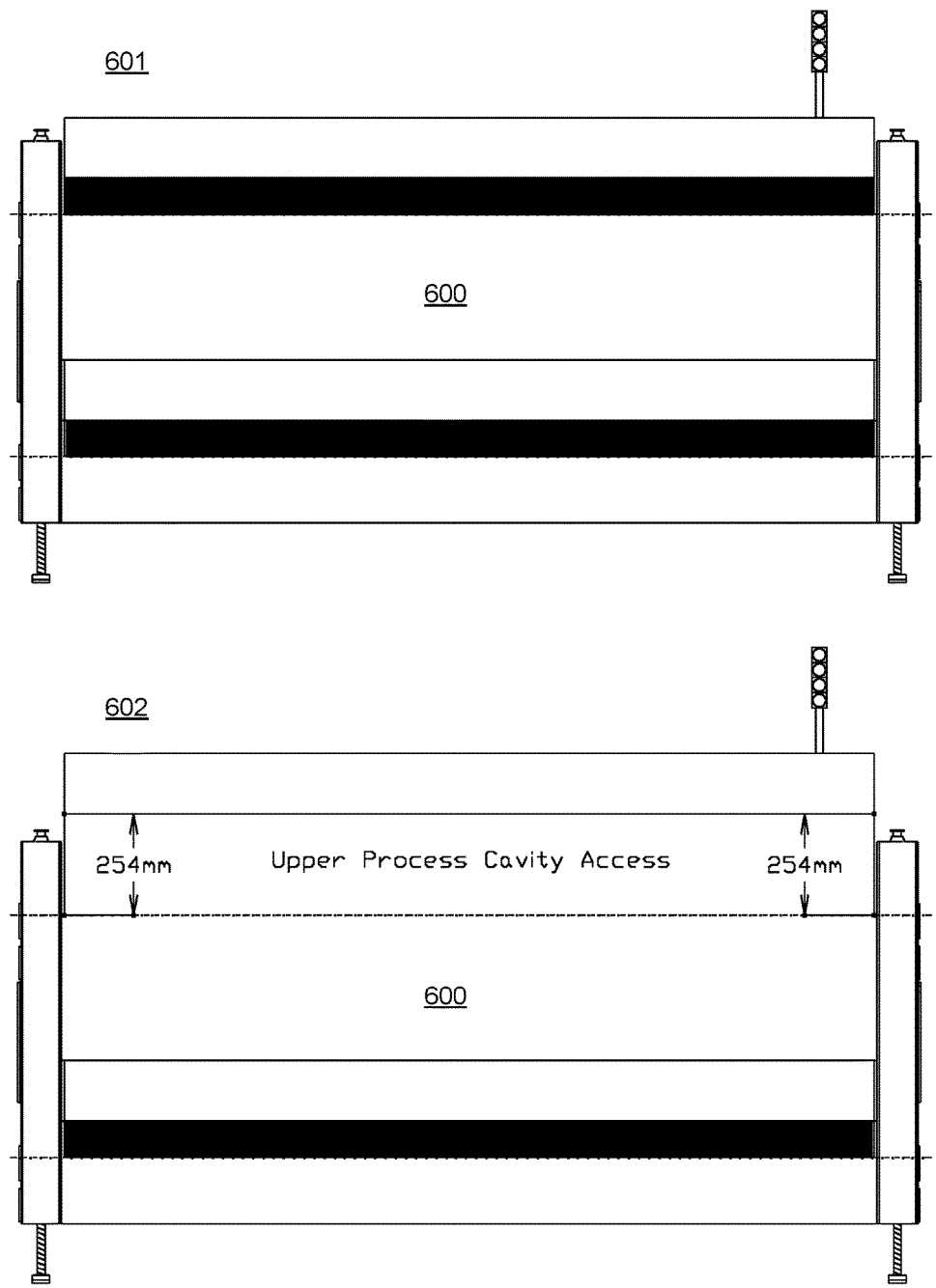
FIG. 6 is a diagram of an example of a machine in an example of an operational state.

FIG. 6 shows a machine 600 in a first state 601 and a second state 602. The machine 600 includes levels that are process cavity levels (e.g., an upper cavity and a lower cavity) that can process material (e.g., boards, etc.), for example, via a conveyor at each level.

In the state 601, the cavities are not accessible via sides of the machine 600. In the state 602, the upper cavity is accessible via at least one side of the machine 600; noting that the upper cavity may be accessible via two opposing sides of the machine. In such an example, the roof of the cavity is raised (e.g., via movement of posts).

Figure 7:
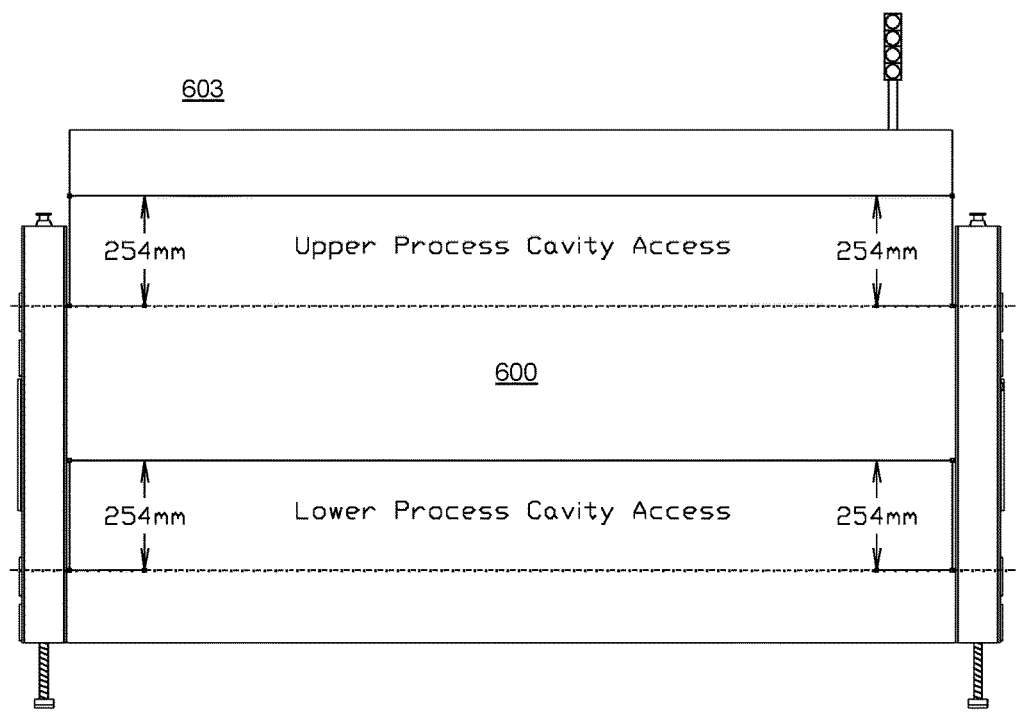
FIG. 7 is a diagram of an example of a machine in an example of an operational state.

In FIG. 7, the machine 600 is in a third state 603 where the lower cavity is accessible via at least one side of the machine 600; noting that the upper cavity may be accessible via two opposing sides of the machine. In such an example, the roof of the cavity is raised (e.g., via movement of posts).

Figure 8:
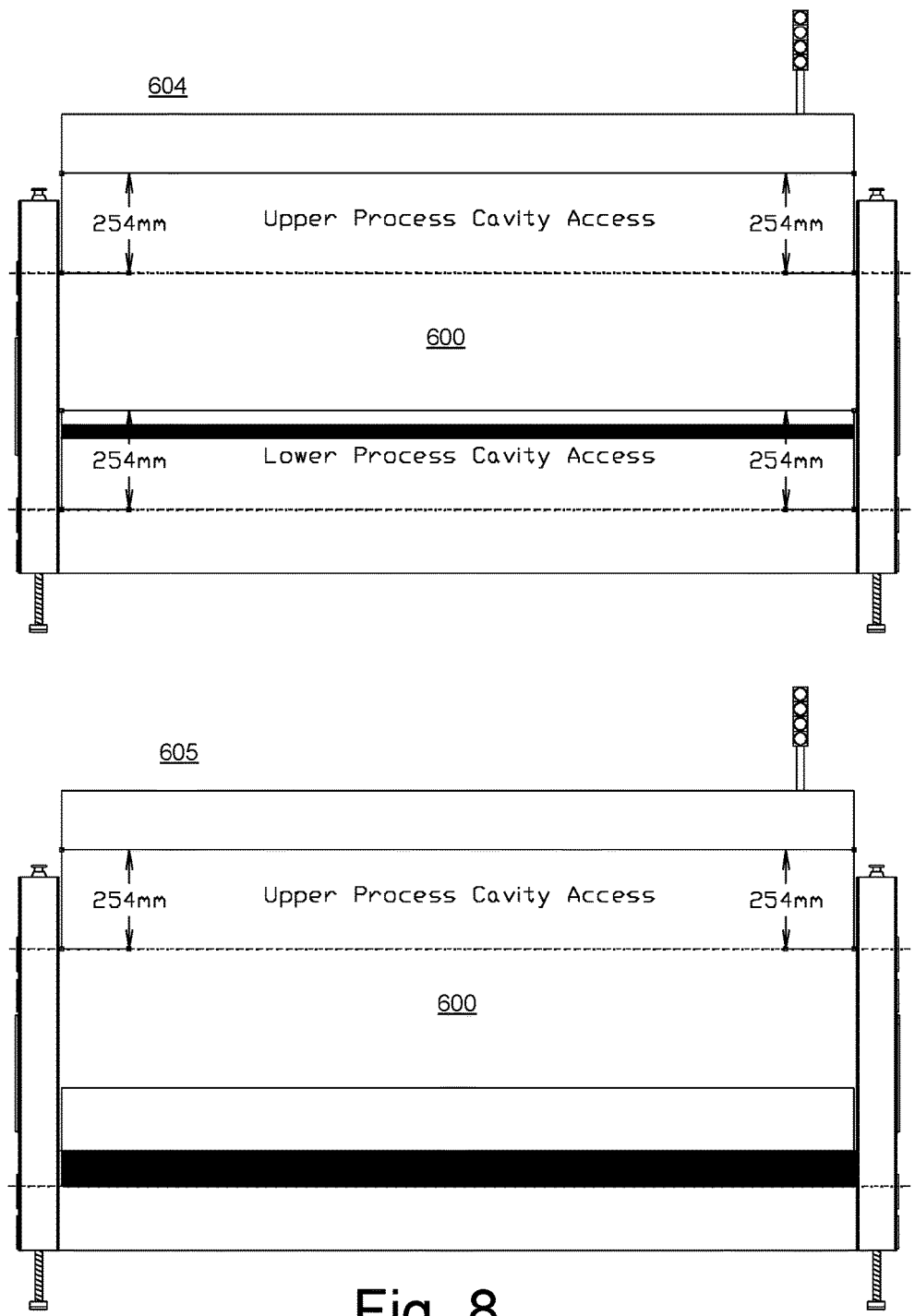
FIG. 8 is a diagram of an example of a machine in an example of an operational state.

In FIG. 8, the machine 600 is in a fourth state 604 and a fifth state 605 where panels are lowered to close the lower cavity.

Figure 9:
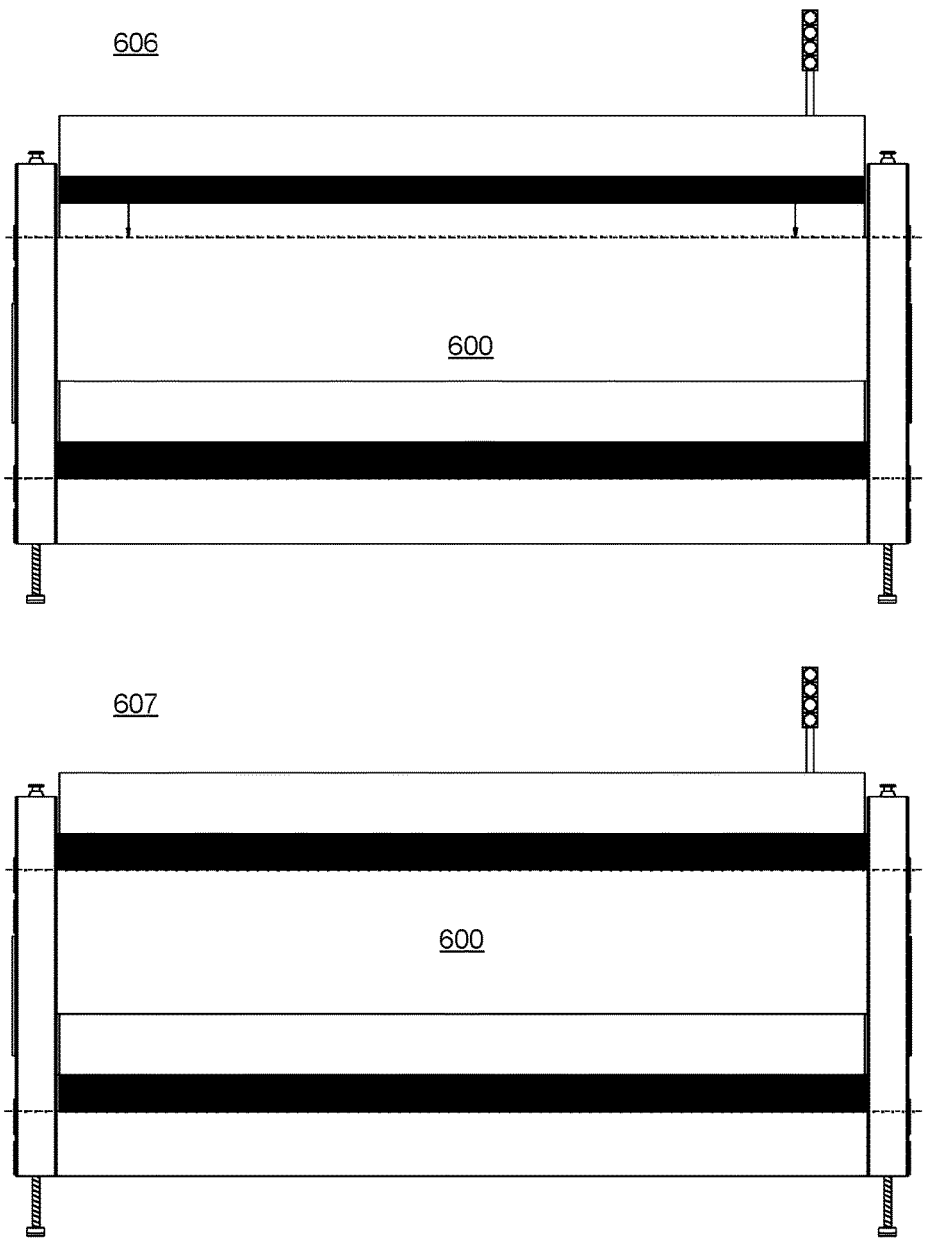
FIG. 9 is a diagram of an example of a machine in an example of an operational state.

In FIG. 9, the machine 600 is in a sixth state 606 and a seventh state 607 where panels are lowered to close the upper cavity.

Figure 10:
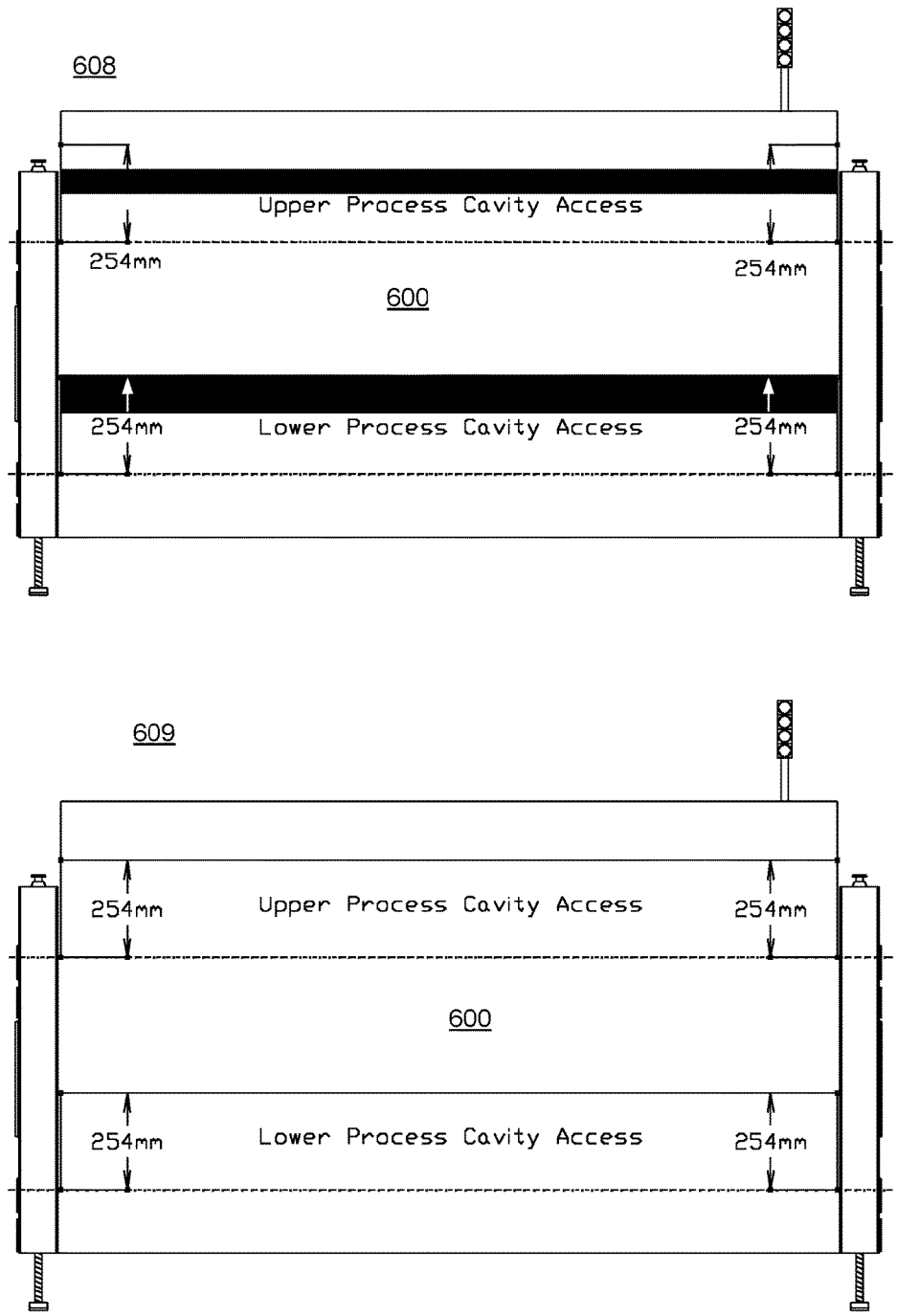
FIG. 10 is a diagram of an example of a machine in an example of an operational state.

In FIG. 10, the machine 600 is in an eighth state 608 and a ninth state 609 where panels are raised to open both the upper cavity and the lower cavity (e.g., for access via both sides (e.g., long opposing sides) of the machine 600.

As an example, a machine may transition to and/or through one or more states (see, e.g., FIGS. 6 to 10). As an example, a method can include transitioning a machine to and/or through one or more states.

As an example, a machine can include a set of posts for movement of panels associated with a first level and a set of posts for movement of panels associated with a second level. Such sets of posts may be independently operatable (e.g., movable) via one or more actuators. Actuation of such one or more actuators may be via one or more controllers and/or one or more control stations.

As an example, a roof of a lower level may move up about 6 inches while, optionally simultaneously, a filler side panel retracts upwards (e.g., into a border region) to create about a 10 inch opening (e.g., for access of a lower process cavity, lower conveyor, etc.).

As an example, a machine may include a distance of about 24 inches between pass lines (e.g., a lower conveyor and an upper conveyor). As an example, a roof of a level may include equipment such as, for example, heaters (e.g., consider a roof region about 5 to 6 inches tall).

As an example, a roof of a level can include equipment such as, for example, one or more of IR lamps, blowers, fresh air intakes, flow duct knives, UV LEDs, etc.

As an example, panels and roofs may be movable via posts. For example, consider a machine with 8 posts, four for a lower level and four for an upper level. In such an example, the posts may be actuated as sets, optionally in unison or independently.

As an example, a machine can include one or more ovens. As an example, a machine can include multiple process chambers. As an example, an upper conveyor of an upper process chamber may operate left to right while a lower conveyor of a lower process chamber operates right to left. As an example, an elevating conveyor may be employed (e.g., optionally as a separate machine that can be operatively coupled to a multilevel machine, etc.) to change elevation of material such as, for example, one or more circuit boards (e.g., PCBs, etc.).

As an example, an effective cure area may be twice a machine length plus time to change elevation (e.g., where a PCB stays hot in an elevator).

As an example, floor space for a multilevel machine or machines may be approximately half that of one or more single level machines (see, e.g., the traditional fluid dispensing line of FIG. 4). As an example, a method can include loading and unloading circuit boards at a region in a line, which may act to reduce a number of operators to run the line. For example, the line of FIG. 5 may optionally be operated by a single operator that can load and unload from a station. As an example, machines may be set in a floor plan with one or more conveyors to assist with loading and unloading.

As an example, soldering may occur in a first room and curing in a second room, as one may be a "cleaner" room (e.g., as to fumes, aerosols, particles, etc.).

In FIG. 4, in comparison, there may be a same capability (e.g., in terms of boards per hour) for the machines 410 and 460; however, the machine 460 can be smaller (e.g., factory floor space may be expensive). Further, the machine 460 may be operated with one operator (e.g., fewer operators) than the machine 410 (e.g., consider loading and unloading and traversing the length in the machine 410). As an example, the machine 460 may include one or more stations (e.g., a single side station or ambidextrous stations).

As an example, in the FIGS. 6 to 10, when a process cavity (e.g., a heated tunnel where a conveyor is) opens, one may see through the machine 600 to the other side (e.g., where both sides open). In the FIGS. 6-10, a black area (e.g., about 4 inches in height) retracts as a 6 inch lift occurs. In conjunction, about a 10 inch vertical access to a process cavity is created. As an example, there may be a gear reduction (e.g., 1.5:1) to create one or more differences in movement (e.g., consider about 6 inches versus about 4 inches).

As an example, a machine can include one or more motors. In such an example, a motor may be operatively coupled to a mechanism that can raise and lower a set of posts. As an example, a mechanism may be operatively coupled to one or more gears that can cause movement at different rates for a given motor rotational speed. As an example, a machine can include one or more hydraulic members. In such an example, one or more hydraulic members may be operatively coupled to a mechanism that can raise and lower a set of posts. As an example, a mechanism may be operatively coupled to one or more gears that can cause movement at different rates for a given speed of a hydraulic member (e.g., as to extension, rotation, etc.). As an example, a hydraulic member may be a piston (e.g., a fluid piston, etc.).

Figure 11:
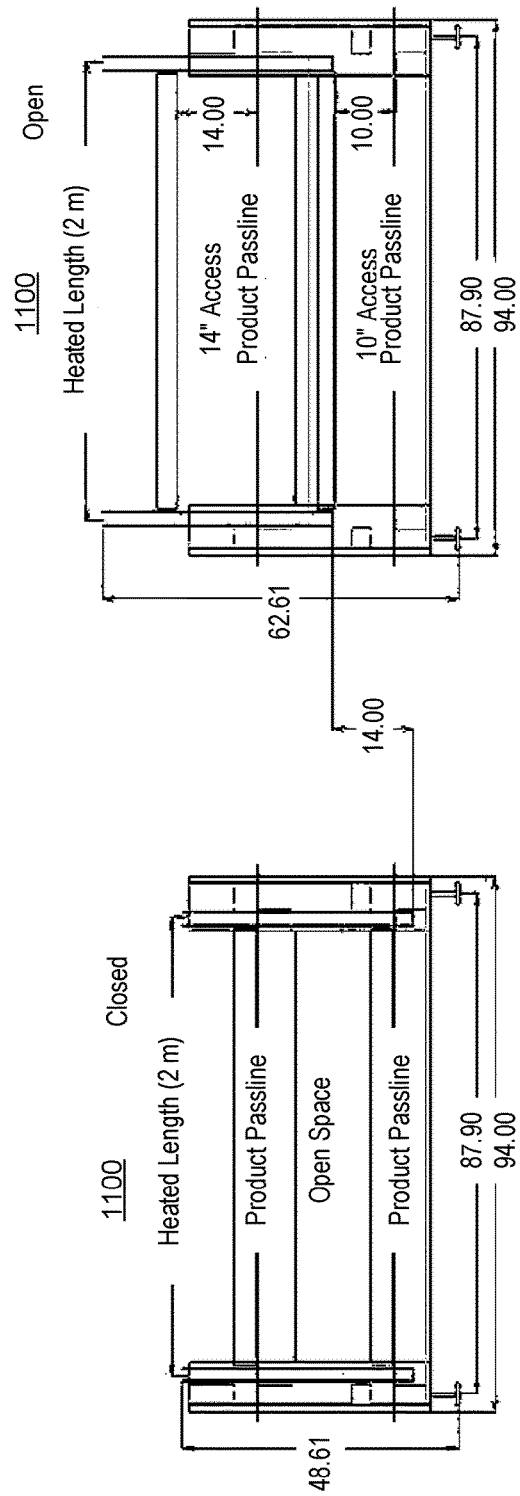
FIG. 11 is a diagram of an example of a machine in examples of an operational states.

FIG. 11 shows an example of a multilevel unit 1100, which may be, for example, a multilevel oven. As an example, the multilevel unit 1100 can include components that perform functions other than those of an oven or can include components that perform functions additional to those of an oven.

In the example of FIG. 11, the multilevel unit 1100 is shown in a closed state and in an open state. Various dimensions are illustrated as examples of dimensions, noting that other dimensions, aspect ratios, etc. may be utilized in constructing a multilevel unit.

As an example, a multilevel unit can include one or more stepper motors. As an example, a stepper motor can be operated such that each pulse received by the motor equates to X amount of movement. In such an example, one pulse signal can be split to a plurality of stepper motors, for example, consider two or more stepper motors as may be associated with lifting and lowering a top, a side, a top and a side, sides, a top and sides, tops, tops and a side, tops and sides, etc. In such an example, a top can be an external top or an internal top and tops can include an external top and an internal top.

As an example, a lifting/lowering mechanism can include a plurality of rangefinders, for example, consider a rangefinder at or proximate to each corner of a multilevel unit for monitoring how each corner is moving. Such an approach may allow for determining whether corners are moving together within a particular amount of acceptable error and/or may allow for determining whether one or more motors may be experiencing stall, delay, etc. As an example, a lifting/lowering mechanism may implement one or more rangefinders and/or one or more encoders; noting that cost of a rangefinder may be less than cost of an encoder. As an example, a limit as to difference between one or more posts being lifted, etc., may be of the order of about 1 cm or less (e.g., consider about 0.5 cm or less). As an example, a rangefinder may include an IR emitter and an IR detector for emission and detection of an IR signal as reflected via a component, for example, to measure distance. As an example, a rangefinder may output a digital and/or an analog signal (e.g., consider an analog signal of about 0 to about 20 mA). As an example, the SHARP GP2Y0A21YK0F rangefinder may be utilized (SHARP Corporation), Sheet No.: E4-A00201 EN (1 Dec. 2006), which is incorporated by reference herein.

As an example, a stepper motor (e.g., or stepper motor driver, etc., as operatively coupled to a stepper motor, etc.) may include an enable/disable line. As an example, a controller may act if one corner gets out of sync (e.g., out of alignment) with one or more of other corners. In such an example, the controller can disable one or more motors in an effort to adjust to level and, for example, to get the motors back in sync. In such an example, a controller can be programmed to effectuate coordinated motion control at least in part via receipt of one or more sensor signals where such control may be via stepper pulse and/or enable/disable signals.

As an example, stepper motors can be utilized in an open loop control system; where, for example, inclusion of one or more sensors can close the loop to provide for a closed loop control system. As an example, one or more sensors may be, for example, one or more of rangefinder, encoder, solenoid engagement, etc.

As an example, for a multilevel unit such as, for example, a double level oven, such a unit can include one or more engagement mechanisms which may include one or more solenoids that can be operable to couple components such that movement of one component causes movement of another component. For example, a controller may include inputs for receiving sensed engagement of four solenoid actuators to ensure engagement before issuing one or more movement signals, for example, to lift one or more components (e.g., prior to causing one or more stepper motors to move a component up). As an example, movement of one component may commence for a period of time that corresponds to a distance moved of the component followed by engagement of another component to that component, for example, via one or more solenoids and one or more pins such that further movement of the component causes combined movement of both components. For example, consider moving a top by about 4 inches (e.g., about 10 cm) and engaging 4 solenoids to engage the top and another component or components (e.g., via liftposts) such that further lifting causes all the engaged components to move in unison (e.g., consider movement up another 10 inches (e.g., about 25 cm).

As an example, a design can separate movement of two levels, which can involve, for example, 8 lift post assemblies (e.g., consider 8 ball screws, motors, rangefinders, etc.).

As an example, a multilevel unit can include an upper level process cavity and a lower level process cavity. As an example, an upper level process cavity may be an upper level tunnel through which one or more products may travel and a lower level cavity may be a lower level tunnel through which one or more products may travel.

As an example, a process cavity can be defined by side panels that can be side reflector panels that can reflect energy such as heat energy. As an example, side panels can be insulated to reduce heat transfer to or from a cavity. As an example, a unit can include one or more retracting side thermal shields, which may be one or more side panels that may define at least in part one or more cavities of a unit.

As an example, a multilevel unit can include an upper level conveyor and a lower level conveyor.

As an example, a lower level of a multilevel unit can include a ceiling or a top that is an internal ceiling or an internal top. As an example, such a ceiling or a top may be fixed or may be movable, for example, to move up and down to provide clearance as to a product path that may be a lower level conveyor. As an example, a ceiling or top of a lower level may be a floor or bottom of an upper level of a multilevel unit.

As an example, a space can exist between a floor of an upper level and a ceiling of a lower level. In such an example, the space may provide for height adjustments of the ceiling of the lower level. As an example, such a space can provide for height adjustments that can be coordinated with one or more side panels of the lower level to provide access to the lower level.

As an example, a unit can include two process chambers. In such an example, an upper conveyor may operate left to right and a lower conveyor may operate right to left (e.g., or vice versa). As an example, an elevating conveyor (e.g., elevator) can be employed (e.g., optionally as a separate unit) to change elevation of one or more products (e.g., whether alone, on a tray, a pallet, etc.). As an example, a multilevel oven can include an effective cure area that is approximately twice the oven length (e.g., plus time to change elevation (e.g., where a product or products may stay hot in elevator that is heated by a heater)). As an example, floor space required can be approximately half that of a fluid dispensing line where, for example, PCBs as products can be loaded/unloaded at a common point in the line (e.g., station), which may reduce number of operators required to run the line.

As an example, a machine can be a multilevel unit that includes a first conveyor configured to receive and convey a circuit assembly; a second conveyor configured to receive and convey a circuit assembly; a first set of opposing side panels adjacent to opposing sides of the first conveyor; a second set of opposing side panels adjacent to opposing sides of the second conveyor; a first mechanism that selectively raises and lowers the first set of opposing side panels; and a second mechanism that selectively raises and lowers the second set of opposing side panels. As an example, side panels may be part of a top of a machine such that raising the top raises the side panels.

As an example, a machined can include lift mechanisms where each of the lift mechanisms includes a stepper motor that can be utilized to cause a component to go up or down (e.g., vertically in a direction substantially aligned with gravity). As an example, stepper motors may be coordinated in their action via a closed loop control scheme. For example, sensors can provide feedback as to heights of a component or components being lifted such that the feedback can be utilized, for example, to level the heights. Such an approach may help to avoid binding, stress, etc., particularly as to components such as one or more side panels that can benefit from being level horizontally.

As an example, a side panel can be rectangular and have a length that is greater than its height. In such an example, the side panel can include a thickness, which may be, for example, of the order of a few centimeters or less. As an example, a side panel can be received via end guides, which may be L-shaped, U-shaped or of another shape. In such an example, levelness of the side panel lengthwise can help to prevent binding of the side panel with respect to the end guides.

As an example, a sensor can be a rangefinder that can output a signal to a controller where the controller can output signals to a plurality of stepper motors. As an example, a plurality of rangefinders may be utilized to provide signals to a controller where the controller can output signals to a plurality of stepper motors. In such an example, the controller may act to maintain levelness of a component lifted or lowered via action of the stepper motors.

As an example, a machine can include one or more accelerometers and/or gravitometers and/or levels. In such an example, a controller may receive a signal that indicates an orientation of a machine with respect to gravity. In such an example, such orientation information may be utilized to determine force (e.g., acceleration of gravity) with respect to one or more movable components such that the controller can better control levelness of such one or more movable components.

As an example, a level signal (e.g., via one or more mechanisms, circuits, etc.) may be utilized to level a machine, for example, to avoid fluid coating material, etc. from running due to influence of gravity in a manner that may be undesirable.

Figure 12:
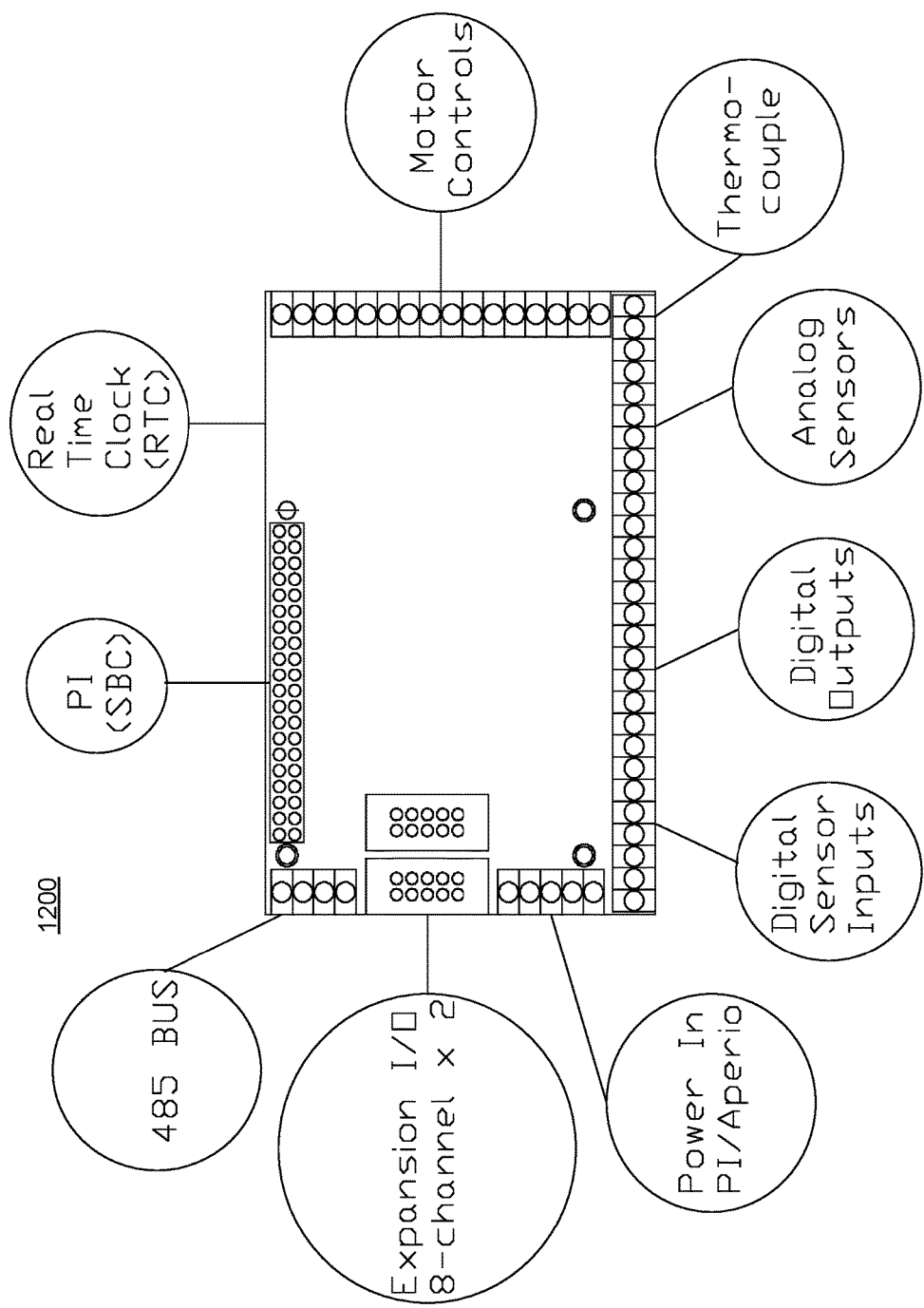
FIG. 12 is a diagram of an example of a controller.

FIG. 12 shows an example of a controller 1200 and examples of components of the controller 1200. As an example, the controller 1200 can be referred to as an APERIO controller (e.g., or αττ∈ριὸ controller) and can include an Atmel Atmega 2560AU, 8-bit AVR RISC-based microcontroller, can be Arduino Compatible (open source software libraries), include 8 optoisolated digital inputs (5-24 vdc), 8 digital outputs (5 vdc), 8 analog inputs (0-5 vdc), 8 PWMs, Coordinated 4 axis motion control (Stepper/Servo), provide power to Raspberry Pi, Real Time Clock (RTC), 1 Thermocouple Input (type K), 16 GPIO expansion (e.g., optoisolated via Aperio expansion module), RS485 bus interface to Rasberry Pi, Additional αττ∈ριὸ LMC board expansion over RS485 bus, 40 pin connector to Raspberry Pi per Hardware Attached on Top (HAT) Specification, Battery backup with power loss detection and one or more other components and/or features. As an example, the controller 1200 can be of dimensions of about 100 mm×about 65 mm (e.g., planar board dimensions).

As an example, the controller 1200 can provide for information handling as to sensors, drivers, motors, relays, etc., which may be utilized, for example, for a machine, a robot, a building automation system, etc.

While the controller 1200 can optionally operate in conjunction with the Raspberry Pi unit, for further Machine Controller and Human Machine Interface (HMI), it can be interfaced by one or more other HMI Systems such as, for example, one or more PCs and PLCs via the serial RS485 bus, the i2c communication bus, etc.

As an example, the controller 1200 can include Digital and Analog Inputs and Outputs compatible with various sensing and/or control devices such as, for example: Zone Control (Temperature, Watts), Relay Expansion, I/O Expansion, Traffic Sensor (Infrared, Inductive Proximity), Encoder, Distance Sensing (Sonar, Lidar, Dopler, Rangefinding, etc.), Stepper/Servo Motor Driver, GPS, Tilt/Yaw, Acceleration, Humidity/Temperature, Push buttons, Limit, Switches, Solvent Sensor ($CO^2$ or Gas Specific), Touch Screen, Tablet/Smartphone, Laptop, PC, Single Board Computer (SBC) (e.g. Raspberry Pi), Keyboard, Mouse, Video (KVM), etc.

As an example, a controller may be operatively coupled to a watt/temperature board, for example, as to one or more ovens, which can include a multilevel oven.

As an example, the controller 1200 can include outputs that can drive one or more devices. As an example, consider driving a relay or relays. As an example, digital inputs of the controller 1200 can accept signals in a range of voltages (e.g., about 5 V to about 24 V). As an example, a signal can be from a beam sensor where a beam/broken beam can trigger issuance of a signal, for example, with respect to a product being transported (e.g., conveyed, lifted, lowered, etc.). As an example, inputs can include inputs from limit switches, proximity sensors, etc. As an example, analog and/or digital inputs may be utilized for receipt of information from, for example, mass air flow sensors, accelerometers, tilt/yaw sensors, etc. As an example, a controller can include pulse/direction for a number of stepper or servo motors.

As an example, a controller such as the controller 1200 can include inputs and outputs for control of motors that control raising and lowering of components to provide access to and/or closure of one or more ovens of a multilevel oven (e.g., to a lower path and an upper path).

As an example, the controller 1200 can be packaged to be stackable with one or more additional controllers. For example, a system can include a plurality of the controllers 1200 that are stacked atop each other. As an example, multiple controllers may be configured in a master/slave arrangement where, for example, a RS485 bus or other bus may be implemented. As an example, a plurality of the controllers 1200 may be mounted remote from one another where, for example, communication can be via wire and/or wireless.

As an example, a Wattage/Temperature Controller can include a PCB that provides PID, closed loop control of both Wattage and Temperature for a single heating zone or for multiple heating zones. For example, a multilevel oven can include multiple wattage/temperature controllers. As an example, such controllers may be operatively coupled to a controller such as the controller 1200.

As an example, a factory automation system can include a Single Board Computer (SBC) and at least one I/O HAT. In such an example, Thermal Systems can utilize one Zone Controller for each heat zone (e.g., one wattage/temperature controller per heat zone). As an example, a factory automation system can include a plurality of SBCs where communication between SBC and distributed controllers may be accomplished via one or more serial buses (e.g., RS485 buses, etc.).

As an example, a controller such as the controller 1200 can include instructions stored in memory. For example, instructions can be processor-executable instructions stored in a computer-readable storage medium that is not a carrier wave and that is non-transitory. As an example, instructions can be or include software written in POSIX Compliant ANSI C, which can enable compatibility with potential third party software and help to ensure cross-platform compatibility (e.g., Microsoft, Macintosh and Unix Variants).

As an example, employ a User Interface can be provided via a display device (e.g., optionally touch screen display device) for control of an entire factory automation line and/or a machine such as, for example, the machine 460 of FIG. 4. As an example, a controller can implement one or more application programming interfaces (APIs). As an example, commands can be passed over Ethernet and/or Wifi to one or more controllers and/or single board computers, for example, to allow setpoints to be updated on the fly from other Human Interfaces (e.g., smart phone (e.g., iPhone device, Samsung device, etc.), mobile device (e.g., computing tablet, etc.), a PC or a laptop).

As an example, a controller can be a Raspberry Pi, Single Board Computer (SBC) that includes, for example, a 900 MHz quad-core ARM Cortex-A7 CPU, 1 GB RAM, 4 USB ports, 40 GPIO pins (i2c, RS485, SPI, etc.), Full HDMI port (video), Ethernet port, Combined 3.5 mm audio jack and composite video, Camera interface (CSI) (5 Megapixel Camera), Display interface (DSI) (video), Micro SD card slot (Operating system and file storage), VideoCore IV 3D graphics core, ARM GNU/Linux (Open Source Operating System and Application Software), Dimensions: 85×56 mm As an example, an I/O HAT (Hardware Attached on Top) can include an Atmel Atmega 2560AU, 8-bit AVR RISC-based microcontroller, can be Arduino Compatible (open source software libraries), can include 8 optoisolated digital inputs (5-24 vdc), can include 8 digital outputs (5 vdc), can include 8 analog inputs (0-5 vdc), can include 8 PWMs, can include control for up to 4 stepper motors, can provide power to Raspberry Pi, can include a Real Time Clock (RTC), can include Thermocouple Input (type K, MAX31855 chip), can include 16 GPIO expansion (optoisolated via ET-MINI-OPTO), can include RS485 bus interface to Rasberry Pi, can include additional I/O board expansion over RS485 bus, can plug on top of Raspberry Pi per Hardware Attached on Top (HAT) Specification, can include dimensions of about 100×about 65 mm.

As an example, a Temperature/Wattage Control Board (Zone Controller) can include an Atmel Amega 328p, 8-bit AVR RISC-based microcontroller, can be Arduino Compatible (open source software libraries), can include RS485 or i2c bus interface to Raspberry Pi, can include Thermocouple Input (type K, MAX31855 chip) (e.g., one or more), can include Solid State Relay (SSR) PWM output (e.g., Zero Cross Fire), Closed Loop Wattage/Temperature Control, can include one or more Temperature Control Algorithms, can include Model-based Predictive Control (MPC), can include analog inputs, can include optoisolated digital inputs, can mount directly to Solid State Relay (SSR), and can include dimensions of about 64 mm×about 57 mm.

As an example, an 8 Channel Relay Module can include optoisolated digital inputs, 120/230 VAC 10A, 30 VDC 10A, can plug into I/O HAT, can be normally open or normally closed, can be of dimensions of about 134 mm×about 53 mm.

As an example, a Traffic Control SMEMA Sensor can include Break the Beam and/or Reflective features, can occupy a space of about 5 mm, can sense presence of one or more products (e.g., one or more PCBs), can be operable in a range of about 2 cm to about 30 cm, can interface to I/O HAT or a Zone Controller, can be of dimensions of about 32 mm×about 14 mm.

As an example, a Stepper Motor Driver can be a bi-polar microstepping driver and can operate, for example, about 2 A/Phase Maximum, about 1.4-1.7 A/Phase without Heatsink, at about Maximum Motor Voltage 30 VDC, can include on-board 5V/3.3V regulation, can operate via microsteps/steps: 1, 2, 4, 8, 16, etc.

As an example, a Mini-Opto, 8 channel Optoisolator can include 8 channel input or output opto-isolation, can plug into an I/O HAT, can provide wide voltage range, can be of dimensions of about 55 mm×about 45 mm.

As an example, the machine 460 of FIG. 4 can include one or more of the aforementioned components. As an example, the machine 460 of FIG. 4 can include one or more of the aforementioned components and a controller such as, for example, the controller 1200 of FIG. 11.

As an example, one or more component can provide for controlled action of a multilevel oven. For example, a controller can be operatively coupled to sensors and motors to control liftposts and/or solenoids that can be part of mechanisms for raising and/or lowering one or more tops, sides, etc. for access to one or more portions of the multilevel oven. As an example, consider a controller that can control four liftposts operated by air or hydraulic cylinders to raise a top of the multilevel oven where one or more solenoids may engage pins with respect to liftposts to allow for lifting of one or more sides (e.g., reflector side panels of a lower level of the multilevel oven). As an example, wiring may pass at least in part through one or more liftposts (e.g., hollow liftposts) such that the wiring may be operatively coupled to one or more components that may be in, for example, a top and/or operatively coupled to a top that can cover an upper level of a multilevel oven. As an example, inside one or more liftposts wiring can be passed where the wiring is for operate of one or more of IR and/or UV and/or humidity and/or modified atmosphere components (e.g., environmental components that can control environment within at least a portion of a multilevel oven). As an example, a controller can control one or more components that can allow for coordinated control of a lower level oven and an upper level oven, for example, to enable optimization of curing of one or more coatings disposed on one or more products that are conveyed through the lower level and the upper level (e.g., a lower level oven and an upper level oven of a multilevel oven). In such an example, a controller may aim to accelerate coating cure time (e.g., cure in lesser time via control).

As an example, where an issue may arise that calls for inspection of a product or products in a lower level and/or in an upper level of a multilevel oven, a controller can receive input that causes raising of one or more components that can provide access to the lower level and/or the upper level of the multilevel oven where, for example, such components may raise independently or together.

As an example, a multilevel oven can include ball screws and stepper motors for moving liftposts (e.g., optionally four per level for a total eight liftposts or four total liftposts where features engage the liftposts for lifting at least side panels of a lower level). In such an example, a controller such as, for example, the controller 1200 can be utilized for control of the stepper motors and/or one or more engagement mechanisms such as, for example, solenoid and pin engagement mechanisms. As an example, the controller 1200 may control raising and/or lowering to maintain levelness (e.g., equal upward motion associated with each liftpost and/or equal downward motion associated with each liftpost).

As an example, an upper level portion of a lift mechanism can include four ball screws (e.g., one at each corner of a rectangular upper level portion) and worm gears and four stepper motors. In such an example, the worm gears can provide for maintaining force such that the upper level portion maintains its height. As an example, a worm gear may provide for a reduction such as, for example, a 30 to 1 reduction. As an example, a stepper motor can be operatively coupled to a worm gear. As an example, a lower level portion can include a similar arrangement of lift mechanism components.

As an example, a multilevel unit can include four ball screws, worm gears and stepper motors and engagement mechanism or mechanisms. In such an example, the engagement mechanism or mechanisms can be solenoid based that can cause pins to move to engage components. As an example, a multilevel unit can include four corners where four lift assemblies are located at or near the four corners (e.g., one assembly per corner). In such an example, four stepper motors and four engagement mechanisms may be utilized for providing access to an upper level cavity and/or to a lower level cavity. In such an example, feedback may be achieved via use of one or more types of sensors (e.g., rangefinders, encoders, etc.). In such an example, feedback may allow for level lifting and closing of one or more components (e.g., top or tops, side or sides, etc.).

A ball screw can be a mechanical linear actuator that translates rotational motion to linear motion. A threaded shaft can provide a helical raceway for ball bearings which can act as a precision screw. A ball screw can apply and/or withstand thrust loads and do so with minimum internal friction.

As an example, a linear actuator can be based on a rotating rod, such as, for example, a threadless ballscrew (e.g., rolling ring drive). For example, consider three (or more) rolling-ring bearings arranged symmetrically in a housing surrounding a smooth (thread-less) actuator rod or shaft. The bearings can be set at an angle to the rod where this angle determines the direction and rate of linear motion per revolution of the rod.

As an example, a stepper motor or step motor or stepping motor can be a brushless DC electric motor that can divide a full rotation into a number of steps. As an example, a motor's position can be commanded to move and hold at one of these steps, for example, without a feedback sensor (e.g., via an open-loop controller). As an example, a feedback sensor or sensors may be provided in a system (e.g., in a unit) such that a plurality of stepper motors may be controlled in a coordinated manner.

As an example, a multilevel oven can include two ovens where each oven is defined by a cavity that includes a top, a bottom and sides. As an example, an upper oven can be defined by a top, a bottom and sides and a lower oven can be defined by a top, a bottom and sides. In such an example, the bottom of the upper oven and the top of the bottom oven may be defined by a common component (e.g., a common wall) or they may be defined by separate components (e.g., two separate walls). Where two separate walls exist as a bottom of an upper oven and a top of a lower oven, a space may exist between the walls where the top of the lower oven may be raised toward the bottom of the upper oven. In such an example, raising of the top of the lower oven may allow for additional space to access one or more portions of the lower oven. In such an example, the cavity of the lower oven may be viewed as being increased. Where a common wall exists as a bottom of an upper oven and a top of a lower oven, the common wall may be raised to allow for additional space to access one or more portions of the lower oven. In such an example, the cavity of the lower oven may be viewed as being increased and, for example, the cavity of the upper oven may be viewed as being decreased.

As an example, sides of a lower oven can be opposing sides that are substantially rectangular and of a length that is greater than their height. In such an example, the sides may be movable such that they may move upwardly to provide access to the lower oven and/or such that they may move downwardly to provide access to the lower oven. In such example, movement upward that provides access can be followed by movement downward that closes the lower oven and movement downward that provides access can be followed by movement upward that closes the lower oven.

As an example, a multilevel oven can include two conveyors. In such an example, during operation one conveyor can move from left to right and the other conveyor can move from right to left. For example, referring to the machine 460 in the example of FIG. 4 (e.g., or FIG. 5), the lower conveyor can convey product from right to left and the upper conveyor can convey product from left to right where the product conveyed may first be conveyed by the lower conveyor and then be conveyed by the upper conveyor (e.g., or vice versa depending on operation, etc.).

As to inspection and/or visual monitoring, a system can include one or more optical inspection units that can include one or more cameras. For example, a controller can include one or more camera interfaces, which may be wired and/or wireless interfaces. As an example, a controller can include one or more CSI-2 (Camera Serial Interface) type of interfaces that can a camera or cameras. As an example, a camera may be a megapixel camera (e.g., from about 1 megapixel in size to about one or more hundreds of megapixels. As an example, an image acquired via a camera can include, for example, one pixel equating to a spot of approximately 10 thousands of an inch square on a product such as, for example, a circuit board. As an example, one or more components may be NVIDIA components. For example, consider an NVIDIA TEGRA processor that can support up to 12 cameras over CSI-2 and up to about 100 megapixels each camera. As an example, camera acquired data can be piped into and processed by a Graphics Processing Unit (GPU) that can include tens of cores or more (e.g., consider 192 cores or more). As an example, a GPU may provide for processing at a rate of about 1.3 gigapixels per second or more.

As an example, a system can include one or more megapixel cameras (e.g., consider one or more 10 megapixel or greater cameras) that may be operatively coupled to one or more processors, controllers, etc., for example, via one or more CSI-2 and/or one or more other suitable interface or interfaces.

As an example, a system can include a CMOS type sensor that may be a Sony/Phase One type of sensor rated at 100 MP as utilized in a IQ3 100 MP digital back where the 100-megapixel CMOS sensor measures about 54 mm×about 40 mm; noting that one or more other types of sensors of lesse megapixels or more megapixels may be utilized.

As an example, one or more processors may process image data for purposes of identifying quality of one or more coated portions of a product. For example, quality can include detecting a lack of coating and/or a characteristic or characteristics of coating (e.g., a glean of coating or other characteristic that may indicate degree of curing, depth of curing, cracking of a coating, etc.). As an example, feedback may be utilized to control one or more aspects of a process implemented at least in part by a multilevel unit.

Figure 13:
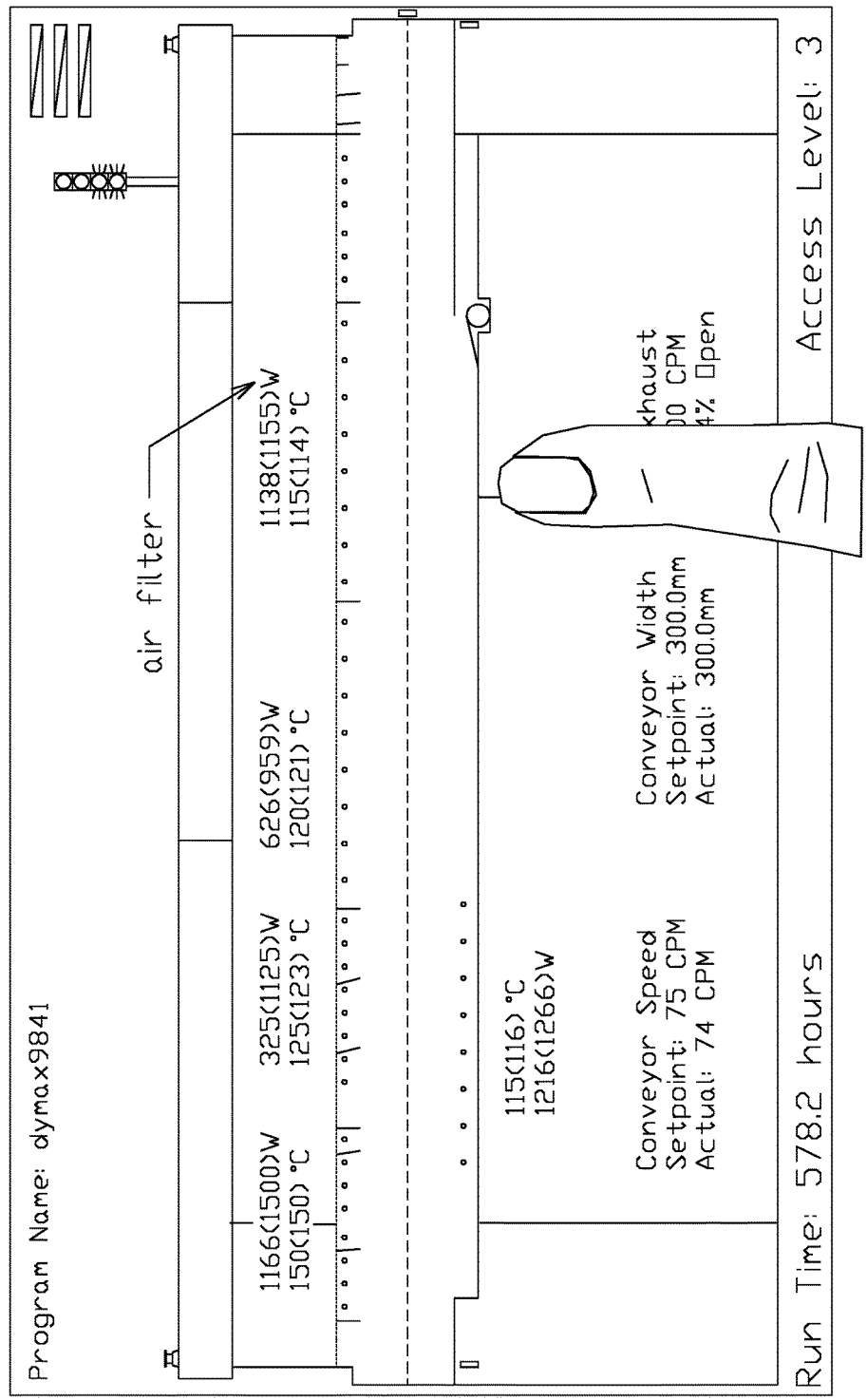
FIG. 13 is a diagram of an example of a display and an example of a graphical user interface.

FIG. 13 shows an example of a graphical user interface (GUI) as rendered to a touch screen. As an example, a GUI may render information for one or more types of equipment. As an example, a GUI may render one or more graphical representations of one or more pieces of equipment where touching of the touch screen display can be received as a signal or command by a controller where the controller can respond. For example, the controller may respond by accessing information (e.g., stored, via wire, wireless, etc.) and transmitting information for rendering to the touch screen, for example, as part of the GUI. As an example, a command entered via a touch screen may be transmitted to a controller where the controller issues one or more signals to cause one or more actions to be taken such as, for example, opening one or more cavities of a multilevel unit.

Figure 14:
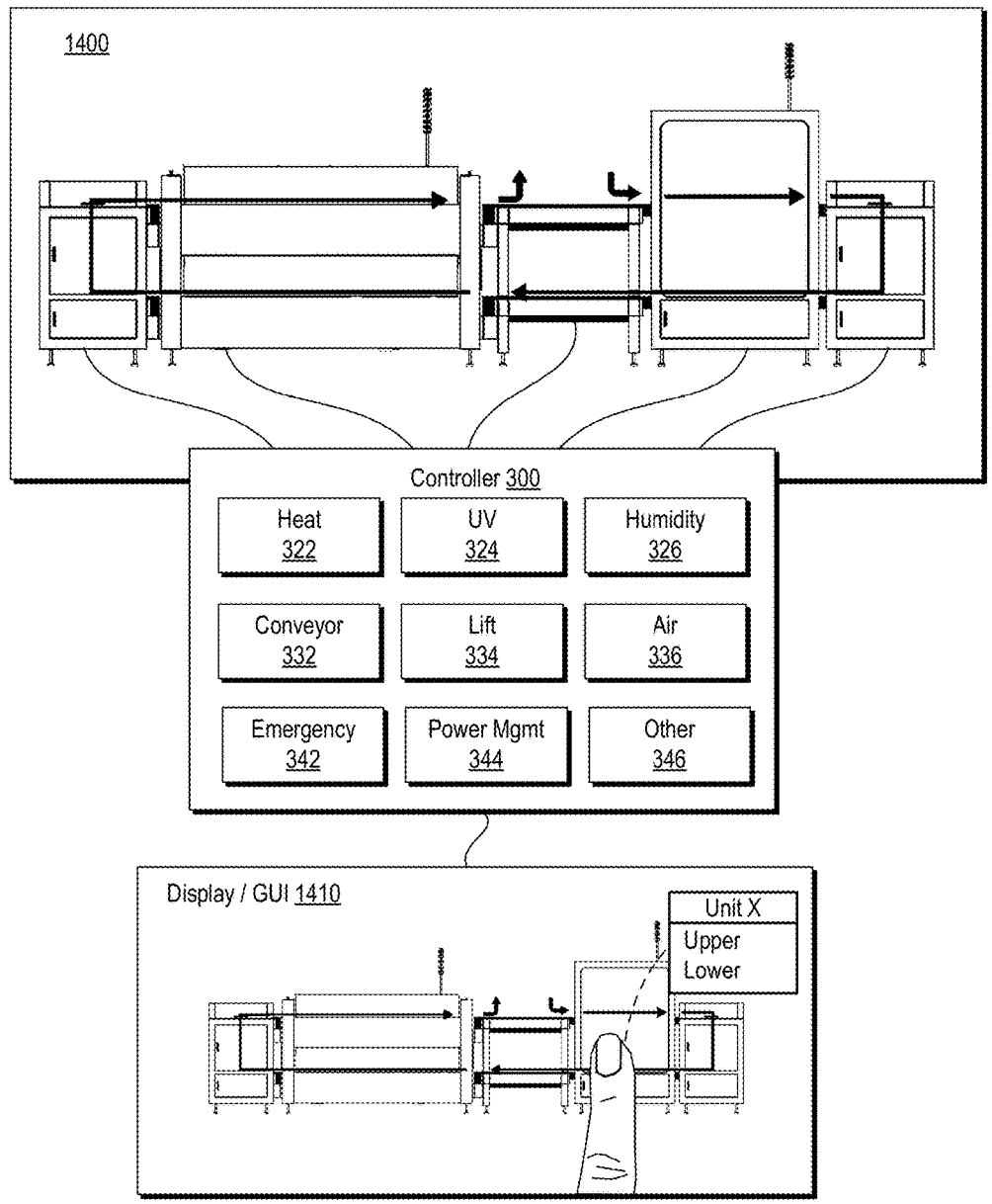
FIG. 14 is a diagram of an example of a system.

FIG. 14 shows an example of a system 1400 that can include the controller 300 and/or be operatively coupled to a controller such as the controller 300 and/or one or more other controllers (see, e.g., the APERIO controller, etc.). As shown, a system can include a display and GUI 1410 where the GUI can include a representation of equipment of a system.

Figure 15:
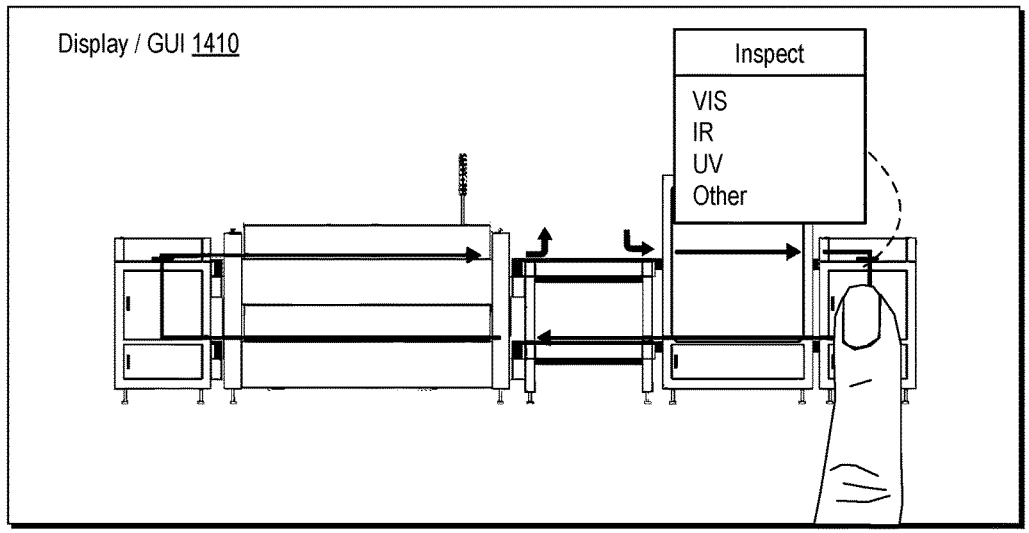
FIG. 15 is a diagram of an example of a display and example graphical user interfaces.
Figure 15:
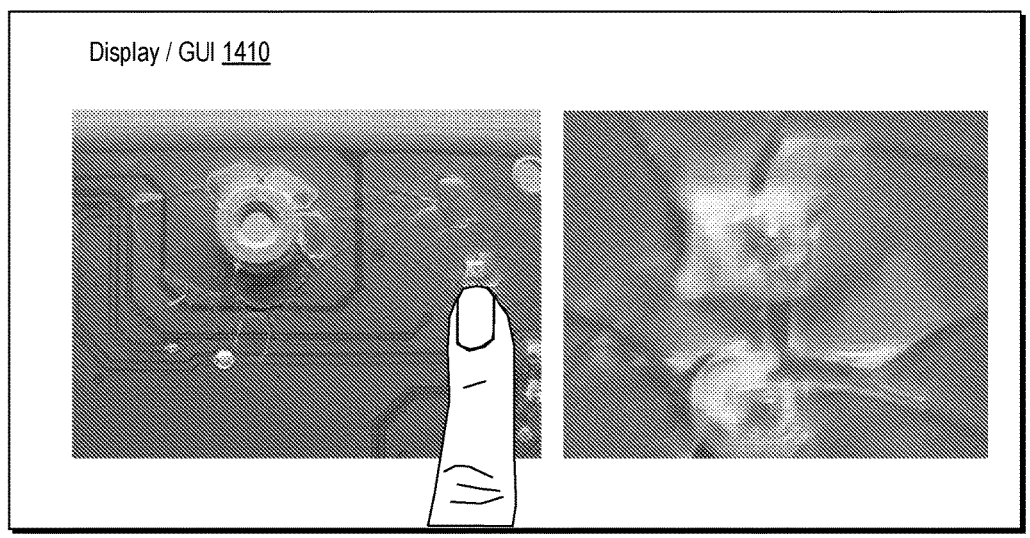

FIG. 15 shows an example of the display and GUI 1410 where a touch can be received to control a camera and/or camera data, which may be, for example, rendered to the display. As shown, an image of a portion of a coated circuit board is shown, noting that such a board may be an already coated and cured board, a board that is coated an uncured, etc. The particular image is for purposes of illustration and explanation as to one of a variety of quality control issues that may exist for a system. As shown, a user may touch an image where an enlarged portion (e.g., zoomed) may be rendered such that a visual inspection may be made as to one or more portions of a product with respect to coating, which, as mentioned, may be uncured, partially cured, fully cured, etc. In such an example, the GUI may be utilized to input information as to an identified problem and a controller may adjust one or more parameters of operating a system to remedy the identified problem. In such an example, the display can be utilized for one or more purposes.

As an example, a mobile app as may be implemented using a mobile device may be available that includes a display where the display of the examples of FIGS. 14 and 15 may be a display of a mobile device (e.g., that executes an app).

Figure 16:
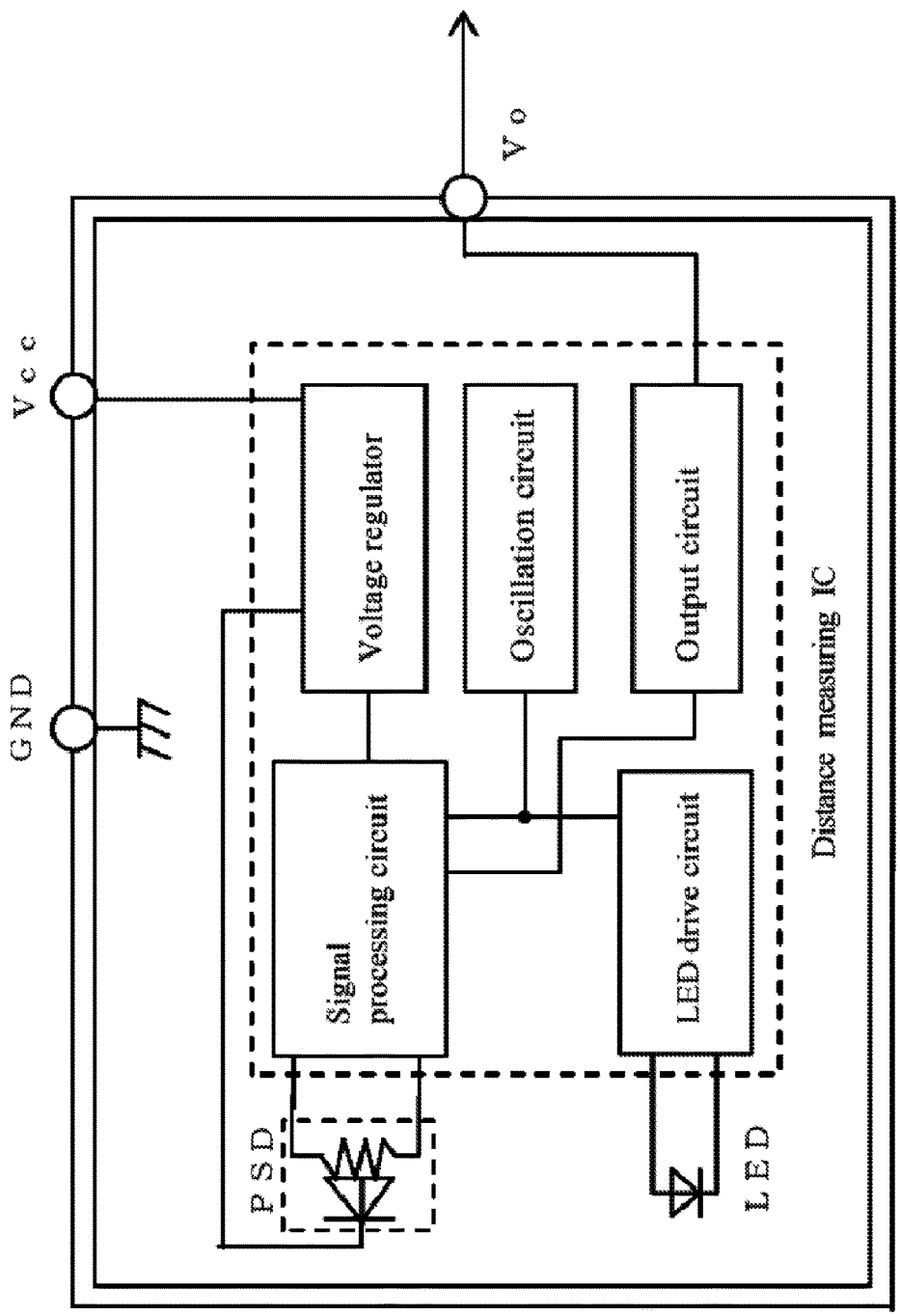
FIG. 16 is a diagram of an example of a rangefinder.

FIG. 16 shows an example of a rangefinder. As mentioned such a rangefinder may be utilized in combination with one or more lift mechanisms, for example, to control one or more components to access a lower level and/or an upper level of a multilevel unit.

Figure 17:
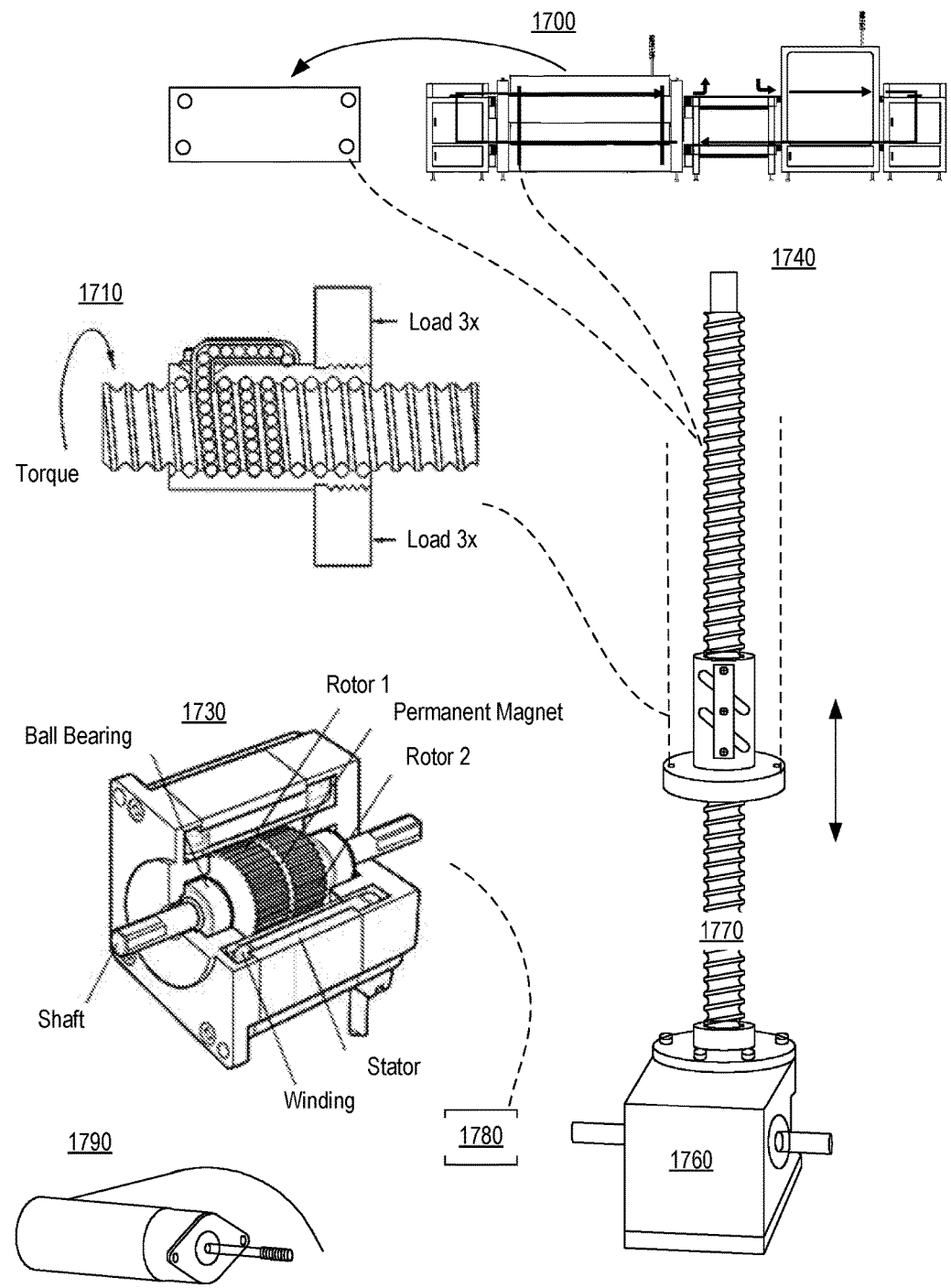
FIG. 17 is a diagram of examples of equipment and an example of a system.

FIG. 17 shows examples of equipment, components, etc. In particular, FIG. 17 shows an example of a ball screw 1710, an example of a stepper motor 1730 and an example of an assembly 1740 that includes a worm gear mechanism 1760 that can rotate a threaded rod, for example, via a coupling 1780 with the stepper motor 1730. In such an example, the ball screw 1710 can include a coupling that is operatively coupled to a component such as a top, a post, etc. In such an example, rotation of the stepper motor 1730 can cause the ball screw 1710 to move upward or downward, which can cause another component to move upward or downward.

As an example, a multilevel unit can include components such as one or more of the components of FIG. 17, which are presented as examples as sizing, shapes, etc. may be selected based on one or more factors. As an example, a multilevel unit can include four corners and four liftposts where the liftposts are operatively coupled to ball screws and stepper motors, for example, via gears (e.g., worm gears, etc.). In such an example, the stepper motors may be controlled via a controller. As an example, to coordinate motion of the stepper motors (e.g., four stepper motors), feedback can be provided to the controller via one or more sensors. In such an example, the controller can control the stepper motors, for example, to maintain a component moved by the four liftposts or components moved by the four liftposts in a relatively level manner. For example, over a span of about 2 meters to about 3 meters, a difference may be less than about 0.5 cm in vertical position (e.g., against gravity) as to a component or components being lifted (e.g., where the liftposts are spaced apart in the horizontal direction by about 2 m to about 3 m. As an example, a multilevel unit can be about one meter across and another pair of liftposts spaced apart by that distance where, again, difference in vertical position of a component may be maintained during lifting to within about 0.5 cm (e.g., corner to corner to corner to corner).

FIG. 17 also shows an example of a system 1700 that can include four liftposts as part of a multilevel unit. In such an example, a controller can control the liftposts to move a top and/or sides up and down. In such an example, engagement mechanisms may be included that can include, for example, solenoids that can drive pins such as the example solenoid pin unit 1790. In such an example, pins may be driven into a liftpost to engage a side panel or associated component such that movement of the liftpost causes movement of the side panel (e.g., or side panels).

Figure 18:
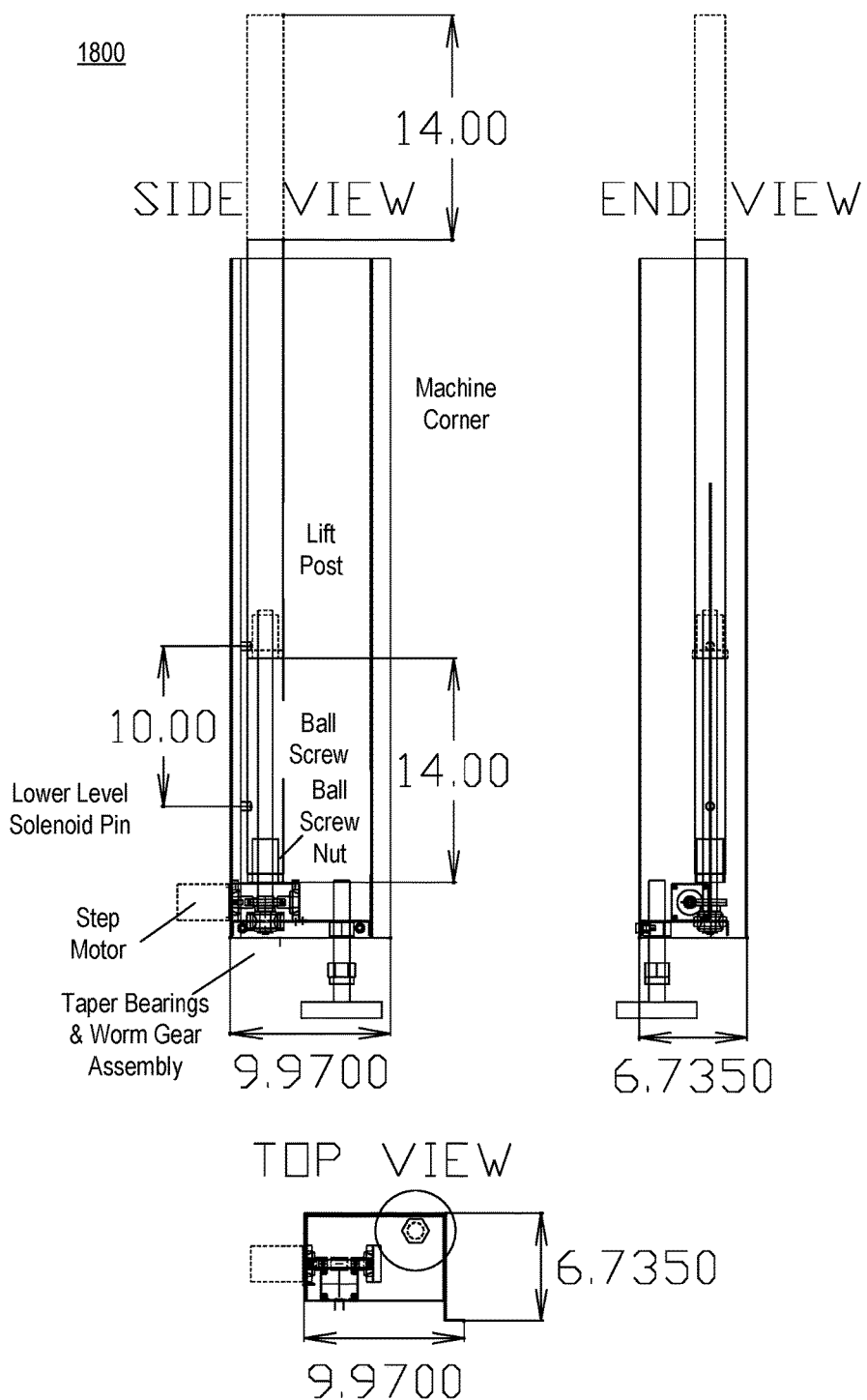
FIG. 18 is a diagram of an example of a lift mechanism.
Figure 19:
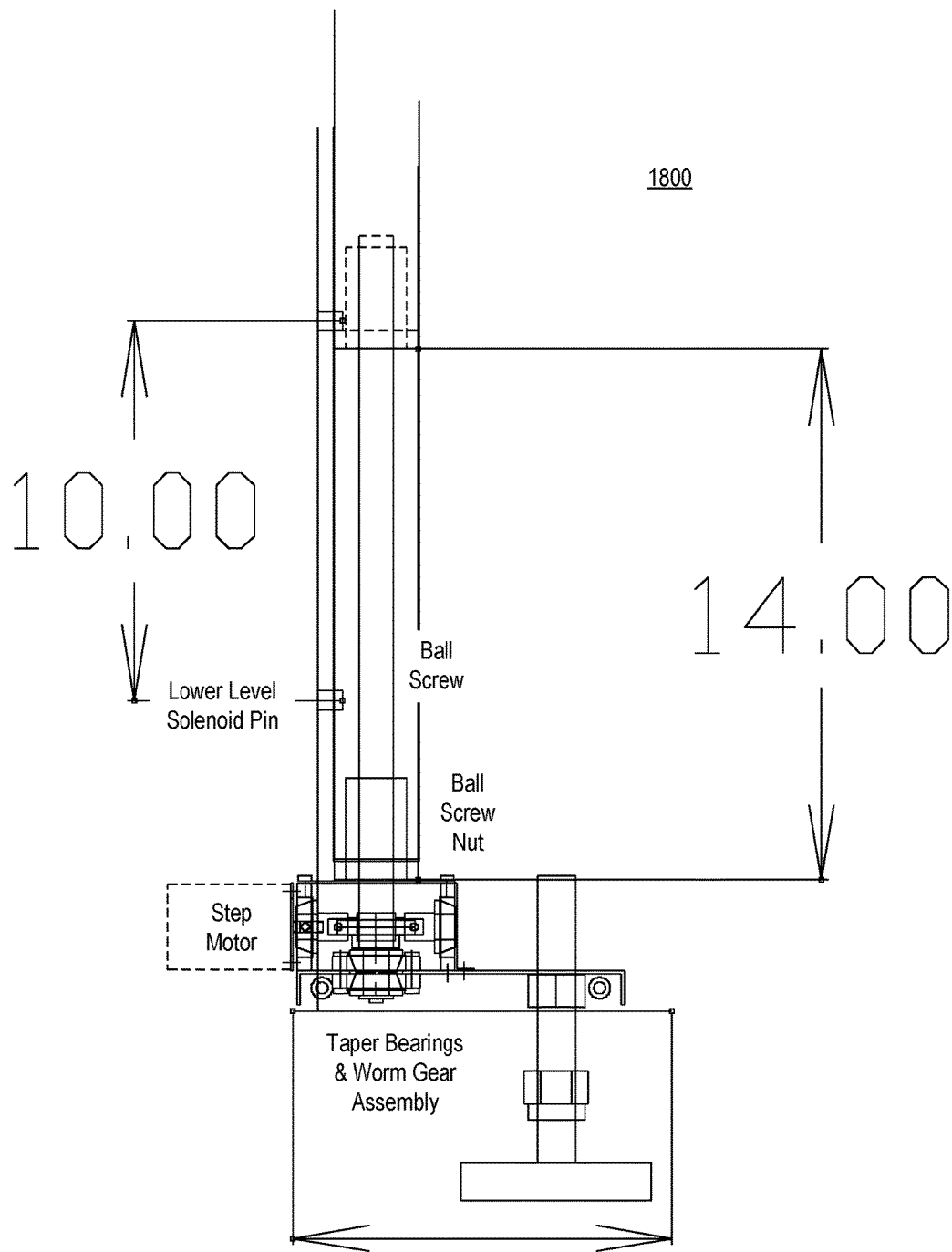
FIG. 19 is a diagram of an example of a lift mechanism.

FIGS. 18 and 19 show an example of a lift mechanism 1800 that is illustrated along with a machine corner. As an example, a machine can include a plurality of such lift mechanisms. As shown, a liftpost is seated with respect to a portion of a ball screw (e.g., a ball screw nut) where the liftpost includes a receptacle for a solenoid pin. As shown, the ball screw is operatively coupled to a stepper motor (e.g., step motor). As an example, a taper bearings and worm gear assembly can be included to operatively couple action of the stepper motor and the ball screw. In such an example, rotation of a shaft of the stepper motor can cause the ball screw nut portion of the ball screw to move up or down such that the liftpost moves up or down. Where a pin is received by the pin receptacle of the liftpost, a component can be thereby engaged to move with the liftpost as driven by the stepper motor. Various dimensions in FIGS. 18 and 19 are given as examples.

As an example, to raise a lower level component or components, one or more electric solenoid pins can move sideways to engage a lift mechanism such that as a top of an upper level begins to go up, a component or components of a lower level can move up too. As an example, side panels of a lower level may retract into side panels (e.g., behind, in front of, between, etc.) side panels of an upper level.

As an example, a machine can include a first conveyor configured to receive and convey a circuit assembly; a second conveyor configured to receive and convey a circuit assembly; a first set of opposing side panels adjacent to opposing sides of the first conveyor; a second set of opposing side panels adjacent to opposing sides of the second conveyor; a first mechanism that selectively raises and lowers the first set of opposing side panels; and a second mechanism that selectively raises and lowers the second set of opposing side panels. In such an example, the machine can include a controller that controls the first and second mechanisms. As an example, a machine can include a roof (e.g., a top) that is operatively coupled to the first mechanism where the first mechanism selectively raises and lowers the roof.

As an example, a method can include conveying a product treated with a curable coating material along a first conveyor of a machine; and elevating the product to a second conveyor of the machine. In such an example, the method can include actuating a mechanism that raises side panels to provide access to the first conveyor. As an example, a method can include actuating a mechanism that raises side panels to provide access to the second conveyor. As an example, a machine can include a first conveyor and a second conveyor at different levels.

As an example, a controller can include one or more processors; memory; and control circuitry that controls mechanisms that raise and lower panels of a multilevel machine. In such an example, the multilevel machine can include a lower level that includes a roof where at least one of the mechanisms raises the roof. As an example, a controller can control at least one mechanism that raises a roof and that raises a set of opposing side panels disposed adjacent to opposing sides of a conveyor of the machine. As an example, a machine can include at least one gear that operates to raise the roof at a different speed than the set of opposing side panels.

As an example, each level of a multilevel machine can include a conveyor where, for example, each of the levels are operatively coupled to an elevator that can move material from one of the levels to another one of the levels.

As an example, a controller can be operatively coupled to a multilevel machine that includes an upper process cavity and a lower process cavity. In such an example, the machine can be substantially block shaped and defined by a length, a width or thickness and a height. In such an example, the cavities can be defined by a length, a width and a height. In such an example, the cavities may be approximately the same with respect to length and width and may be approximately the same or different with respect to height. As an example, such cavities can be defined at least in part by opposing sides where the upper process cavity can include opposing sides and the lower process cavity can include opposing sides. As an example, the opposing sides may be movable at least in part in a heightwise direction for creating openings for access to their respective process cavities. As an example, sides may be operatively coupled to or part of a top where movement of the top moves the sides (e.g., consider opposing sides of an upper process cavity). As an example, a lower process cavity can include a top that is internal and that may be operatively coupled to opposing sides of the lower process cavity such that movement of the internal top can move the sides.

As an example, a lift mechanism can include a plurality of liftposts that can include, for example, ball screws operatively coupled to stepper motors (e.g., optionally via gear boxes, etc.). As an example, a controller can control the lift mechanism such that one or more tops and/or one or more sides are maintained relatively level (e.g., horizontal along top and bottom edges) during lifting and/or lowering. As an example, a controller may be operatively coupled to one or more engagement mechanisms such as a pin engagement mechanism that can cause a pin to translate in/out to engage a component (e.g., via a receptacle such as a hole, a hook, etc.). In such an example, pin engagement may occur where a pin strength is sufficient to support one or more components for purposes of lifting and/or lowering the one or more components. As an example, two pins may be utilized per side for opposing side panels of a lower level process cavity of a multilevel process cavity machine. As an example, a rangefinder may provide a signal that can be utilized to determine when to actuate a pin engagement mechanism. For example, a distance can be compared to a predetermined distance to trigger engagement such that a pin to be translated can engage a receptacle. As an example, a machine can include posts and solenoids and rangefinders where signals from one or more of the rangefinders may be utilized to trigger the solenoids to translate pins to engage the posts.

CONCLUSION

Although various examples of methods, devices, systems, etc., have been described in language specific to structural features and/or methodological acts, it is to be understood that the subject matter defined in the appended claims is not necessarily limited to the specific features or acts described. Rather, the specific features and acts are disclosed as examples of forms of implementing the claimed methods, devices, systems, etc.

What is claimed is:
1. A machine comprising:
a first conveyor configured to receive and convey a circuit assembly;
a second conveyor configured to receive and convey a circuit assembly;
a first set of opposing side panels adjacent to opposing sides of the first conveyor;
a second set of opposing side panels adjacent to opposing sides of the second conveyor;
a first mechanism that selectively raises and lowers the first set of opposing side panels; and
a second mechanism that selectively raises and lowers the second set of opposing side panels.
2. The machine of claim 1 comprising a controller that controls the first and second mechanisms.
3. The machine of claim 1 comprising a roof that is operatively coupled to the first mechanism wherein the first mechanism selectively raises and lowers the roof.
4. A method comprising:
conveying a product treated with a curable coating material along a first conveyor of a machine; and
elevating the product to a second conveyor of the machine.
5. The method of claim 4 further comprising actuating a mechanism that raises side panels to provide access to the first conveyor.
6. The method of claim 4 further comprising actuating a mechanism that raises side panels to provide access to the second conveyor.
7. The method of claim 4 wherein the machine comprises the first conveyor and the second conveyor at different levels.
8. A controller comprising:
one or more processors;
memory; and
control circuitry that controls mechanisms that raise and lower panels of a multilevel machine.
9. The controller of claim 8 wherein the multilevel machine comprises a lower level that comprises a roof and wherein at least one of the mechanisms raises the roof.
10. The controller of claim 9 wherein the at least one of the mechanisms raises the roof and raises a set of opposing side panels disposed adjacent to opposing sides of a conveyor of the machine.
11. The controller of claim 10 wherein at least one gear operates to raise the roof at a different speed than the set of opposing side panels.
12. The controller of claim 8 wherein each level of the multilevel machine comprises a conveyor and wherein each of the levels are operatively coupled to an elevator that can move material from one of the levels to another one of the levels.

* * * * *